(12) United States Patent
Kamijima

(10) Patent No.: US 7,157,760 B2
(45) Date of Patent: Jan. 2, 2007

(54) MAGNETIC MEMORY DEVICE AND METHOD OF MANUFACTURING MAGNETIC MEMORY DEVICE

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 203 days.

(21) Appl. No.: 10/950,399

(22) Filed: Sep. 28, 2004

(65) Prior Publication Data
US 2005/0068825 A1 Mar. 31, 2005

(30) Foreign Application Priority Data
Sep. 30, 2003 (JP) ............................. 2003-342623

(51) Int. Cl.
*H01L 29/76* (2006.01)
*H01L 29/94* (2006.01)
*H01L 31/62* (2006.01)
*H01L 31/113* (2006.01)
*H01L 31/119* (2006.01)

(52) U.S. Cl. ................... 257/295; 257/421; 257/296; 257/E27.005; 438/3

(58) Field of Classification Search ............... 257/295, 257/296, 421, E27.005
See application file for complete search history.

(56) References Cited

U.S. PATENT DOCUMENTS

| 5,343,422 A | 8/1994 | Kung et al. |
| 5,629,922 A | 5/1997 | Moodera et al. |
| 7,002,840 B1 * | 2/2006 | Kamijima et al. ........... 365/173 |
| 7,026,677 B1 * | 4/2006 | Kamijima et al. ........... 257/295 |
| 7,064,367 B1 * | 6/2006 | Hatate et al. ................ 257/295 |
| 2005/0052903 A1 * | 3/2005 | Hayashi ....................... 365/158 |
| 2005/0068825 A1 * | 3/2005 | Kamijima ..................... 365/202 |

FOREIGN PATENT DOCUMENTS

| JP | A 9-091949 | 4/1997 |
| JP | A 2001-273759 | 10/2001 |

* cited by examiner

*Primary Examiner*—B. William Baumeister
*Assistant Examiner*—Igwe U. Anya
(74) *Attorney, Agent, or Firm*—Oliff & Berridge, PLC

(57) ABSTRACT

The present invention provides a magnetic memory device capable of stably writing information by efficiently using a magnetic field generated by current flowing in a conductor, which can be manufactured more easily, and a method of manufacturing the magnetic memory device. The method includes: a stacked body forming step of forming a pair of stacked bodies S20a and S20b on a substrate 31; a lower yoke forming step of forming a lower yoke 4B so as to cover at least the pair of stacked bodies S20a and S20b; and a write line forming step of simultaneously forming a pair of first parts 6F and write bit lines 5a and 5b so as to be disposed adjacent to each other in a first level L1 via an insulating film 7A as a first insulating film on the lower yoke 4B. Thus, the manufacturing process can be more simplified.

10 Claims, 18 Drawing Sheets

「0」

「1」

MAGNETIC MEMORY DEVICE AND METHOD OF MANUFACTURING MAGNETIC MEMORY DEVICE

BACKGROUND OF THE INVENTION

1. Field of the Invention

The present invention relates to a magnetic memory device having a magnetoresistive element including a magneto-sensitive layer whose magnetization direction changes according to an external magnetic field and recording/reading information by using a change in the magnetization direction of the magneto-sensitive layer and to a method of manufacturing the same.

2. Description of the Related Art

Conventionally, as general memories used for an information processor such as a computer or a communication device, volatile memories such as a DRAM (Dynamic Random Access Memory) and an SRAM (Static RAM) are used. The volatile memories have to be refreshed by always supplying current to hold stored information. When the power source is turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing such that information processing can be performed everywhere at any time is rapidly being progressed. Development of a nonvolatile memory adapted to higher-speed processing as a key device of such information device development is in strong demand.

As a technique effective to increase the speed of the nonvolatile memory, a magnetic random access memory (hereinbelow, described as MRAM) is known in which magnetic memory elements each for storing information in accordance with the magnetization direction along the axis of easy magnetization of a ferromagnetic layer are arranged in a matrix. The MRAM stores information by using a combination of the magnetization directions in two ferromagnetic members. On the other hand, stored information is read by detecting a resistance change (that is, a change in current or voltage) which occurs between the case where the magnetization direction is parallel to a reference direction and the case where the magnetization direction is antiparallel to the reference direction. Since the MRAM operates with the principle, it is important that the resistance change ratio is as high as possible to perform stable writing and reading in the MRAM.

The MRAM currently used in practice utilizes the giant magneto-resistive (GMR) effect. The GMR effect is a phenomenon such that when two magnetic layers are disposed so that their axes of easy magnetization are parallel with each other, in the case where the magnetization directions of the layers are parallel to the axis of easy magnetization, the resistance value becomes the minimum. In the case where the magnetization directions are antiparallel with the axis of easy magnetization, the resistance value becomes the maximum. An MRAM using a GMR element capable of obtaining such a GMR effect (hereinbelow, described as GMR-MRAM) is disclosed in, for example, U.S. Pat. No. 5,343,422.

Recently, aiming at further improvement in storing speed, access speed, and the like, an MRAM having a TMR element using tunneling magneto-resistive effect (TMR) is proposed in place of the GMR-MRAM. The TMR effect is an effect such that the tunnel current passing through an insulating layer changes in accordance with relative angles of the magnetization directions of two ferromagnetic layers sandwiching a very-thin insulating layer (tunnel barrier layer). When the magnetization directions of the two ferromagnetic layers are parallel with each other, the resistance value becomes the minimum. On the contrary, when the magnetization directions are antiparallel to each other, the resistance value becomes the maximum. In the TMR-MRAM, when the TMR element has a configuration of, for example, "CoFe/aluminum oxide/CoFe", the resistance change ratio is high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a current magnetic field is generated by passing current to a conductor as a write line disposed near the TMR element. By using the current magnetic field, the magnetization direction of the magnetic layer in the TMR element is changed to a predetermined direction, thereby storing information. As a method of reading stored information, a method of passing current in the direction perpendicular to a tunnel barrier layer and detecting a resistance change in the TMR element is known. Such TMR-MRAM techniques disclosed in U.S. Pat. No. 5,629,922 and Japanese Patent Laid-open No. Hei 9-91949 are known.

Recently, higher packing density of a magnetic memory device is in increasing demand and, accordingly, reduction in the size of the TMR element is also required. As the TMR element is becoming finer, due to the influence of a demagnetizing field generated by magnetic poles at both ends of the TMR element, a large magnetic field is necessary to adjust the magnetization direction in a magnetic layer (free magnetization direction layer) for storing information to a predetermined direction, and write current required at the time of writing information is increasing. To address the problem, a magnetic memory cell having a structure in which a closed magnetic circuit is formed in cooperation with the free magnetization direction layer around a conductor (write line) near the TMR element is proposed (refer to, for example, Japanese Patent Laid-open No. 2001-273759). According to Japanese Patent Laid-open No. 2001-273759, the closed magnetic circuit is constructed by a free magnetization direction layer related to recording, so that the adverse influence exerted by the demagnetizing field can be avoided and a magnetic memory device of high packing density can be realized. Further, in this case, both of two write lines extend in the closed magnetic circuit, so that magnetization can be efficiently inverted.

However, in the magnetic memory device including the magnetic memory cell having the closed magnetic circuit structure as disclosed in Japanese Patent Laid-open No. 2001-273759, the structure is more complicated as compared with a magnetic memory device which does not have the closed magnetic circuit structure. At the time of manufacture, a larger number of processes is therefore necessary, so that reduction in the number of processes is demanded.

SUMMARY OF THE INVENTION

The present invention has been achieved in consideration of such problems and its object is to provide a magnetic memory device to which information can be stably written by efficiently using a magnetic field generated by current flowing in a conductor and which can be manufactured more easily and a method of manufacturing the same.

A magneto-resistive element according to a first aspect of the invention has: a first write line; a second write line extending so as to cross the first write line; and a magneto-resistive element. The magneto-resistive element includes: a magnetic yoke disposed along a circumferential direction so as to surround the first and second write lines in a region in which the first and second write lines cross each other; and a stacked body including a magneto-sensitive layer of which magnetization direction changes according to an external magnetic field and which is magnetically coupled to the magnetic yoke. The first and second write lines are disposed so as to be adjacent to each other via an insulating film in a first level in a region surrounded by the magnetic yoke. "Surrounding" here denotes not only surrounding in a completely closed annular shape but also imperfect surrounding in a state where a part is open. Imperfect surrounding also includes a case where a surrounding has a stick or plate shape. The "circumferential direction" denotes a direction around the conductor. The "external magnetic field" denotes a magnetic field generated by the current flowing in the conductor or a return magnetic field generated in the magnetic yoke. The expression of "being disposed so as to be adjacent to each other" is not limited to the case where the under and top faces of the first write line and those of the second write line coincide with each other but also includes the case where the under and top faces of the first write line and those of the second line are at different levels. However, the expression does not include the case where the first and second write lines include an overlapped part in the layer stack direction (in the region surrounded by the magnetic yoke).

A magnetic memory device according to a second aspect of the invention includes: a first write line; a second write line extending so as to cross the first write line; and a magnetic memory cell which includes a pair of magneto-resistive elements. Each of the pair of magneto-resistive elements has a magnetic yoke disposed along a circumferential direction so as to surround the first and second write lines in a region in which the first and second write lines cross each other; and a stacked body including a magneto-sensitive layer of which magnetization direction changes according to an external magnetic field and which is magnetically coupled to the magnetic yoke. The pair of magneto-resistive elements shares a part of the magnetic yoke. The first and second write lines are disposed so as to be adjacent to each other via an insulating film in a first level in the region surrounded by the magnetic yoke.

In the magnetic memory device according to the first and second aspects of the invention, the first and second write lines are disposed so as to be adjacent to each other in a first level in the region surrounded by the magnetic yoke. Consequently, at the time of manufacture, the first and second write lines can be formed simultaneously in the region surrounded by the magnetic yoke.

In the magnetic memory device according to the second aspect of the invention, either a pair of first write lines or a pair of second write lines in a region surrounded by a pair of magnetic yokes is connected to each other via a connection conductor provided in a second level different from the first level in a region other than the region surrounded by the pair of magnetic yokes. In this case, preferably, a part of the pair of magnetic yokes is provided in the second level.

In the magnetic memory device according to the second aspect of the invention, each of the pair of magnetic yokes comprises: a pair of pillar yokes extending in a direction orthogonal to a layer stacked face of the stacked body while facing each other over the first and second write lines; and a beam yoke to which one end of each of the pair of pillar yokes is connected, and has a sectional shape a part of which is open. The pair of magneto-resistive elements may share at least one of the pair of pillar yokes. In this case, it is preferable that the beam yoke be provided in the second level. Alternately, each of the pair of magnetic yokes may include: a pair of pillar yokes extending in a direction orthogonal to a layer stacked face of the stacked body while facing each other over the first and second write lines; and a pair of beam yokes to which one end of each of the pair of pillar yokes is connected; and has a closed sectional shape. The pair of magneto-resistive elements may share at least one of the pair of pillar yokes. In this case, it is preferable that one of the pair of beam yokes be provided in the second level. Particularly, it is preferable that one on the side far from the stacked body, of the pair of beam yokes be provided in the second level. A part connected to the stacked body, in the magnetic yoke may also serve as the magneto-resistive layer.

A method of manufacturing a magnetic memory device according to a first aspect of the invention is a method of manufacturing a magnetic memory device comprising a first write line, a second write line extending so as to cross the first write line, and a magneto-resistive element having a stacked body including a magneto-sensitive layer whose magnetization direction changes according to an external magnetic field and a magnetic yoke. The method includes: a first step of forming the stacked body on a substrate in which a rectifier is provided; a second step of forming a lower yoke so as to cover at least the stacked body; a third step of simultaneously forming the first and second write lines so as to be disposed adjacent to each other in a first level via a first insulating film on the lower yoke; and a fourth step of forming the magnetic yoke disposed along a circumferential direction so as to surround the first and second write lines in cooperation with the lower yoke by providing an upper yoke via a second insulating film around the first and second write lines.

A method of manufacturing a magnetic memory device according to a second aspect of the invention is a method of manufacturing a magnetic memory device comprising a first write line, a second write line extending so as to cross the first write line, and a pair of magneto-resistive elements each having a stacked body including a magneto-sensitive layer whose magnetization direction changes according to an external magnetic field and a magnetic yoke. The method includes: a first step of forming a pair of stacked bodies on a substrate in which a pair of rectifiers is provided; a second step of forming a lower yoke so as to cover at least the pair of stacked bodies; a third step of simultaneously forming a pair of first and second write lines so as to be disposed adjacent to each other in a first level via a first insulating film on the lower yoke; and a fourth step of forming the pair of magnetic yokes disposed along a circumferential direction so as to surround the pair of first and second write lines in cooperation with the lower yoke by providing an upper yoke via a second insulating film around the pair of first and second line lines, the pair of magnetic yokes having a common part.

Since the methods of manufacturing a magnetic memory device according to the first and second aspect of the invention include the step of simultaneously forming the pair of first write lines and the pair of second write lines so as to be disposed adjacent to each other in the first level, as compared with the case of separately forming the first and second write lines, the number of processes is reduced.

The method of manufacturing a magnetic memory device according to the second aspect of the invention can further include a fifth step of forming a connection conductor for connecting the pair of first write lines formed in the third step in a second level different from the first level in the region other than the region surrounded by the magnetic yokes. In this case, it is preferable to simultaneously perform formation of the upper yoke in the fourth step and formation of the connection conductor in the fifth step.

Since the first and second write lines are disposed so as to be adjacent to each other via an insulating film in the first level in the region surrounded by the magnetic yoke, the magnetic memory devices according to the first and second aspects of the invention can be formed by a smaller number of processes.

Since the method of manufacturing a magnetic memory device according to the invention includes the third step of simultaneously forming the first and second write lines so as to be disposed adjacent to each other in the first level via the first insulating film over the lower yoke, the first and second write lines can be formed simultaneously in the region surrounded by the magnetic yoke. Thus, the manufacturing process can be simplified.

Other and further objects, features and advantages of the invention will appear more fully from the following description.

DETAILED DESCRIPTION OF THE PREFERRED EMBODIMENTS

Figure 1:
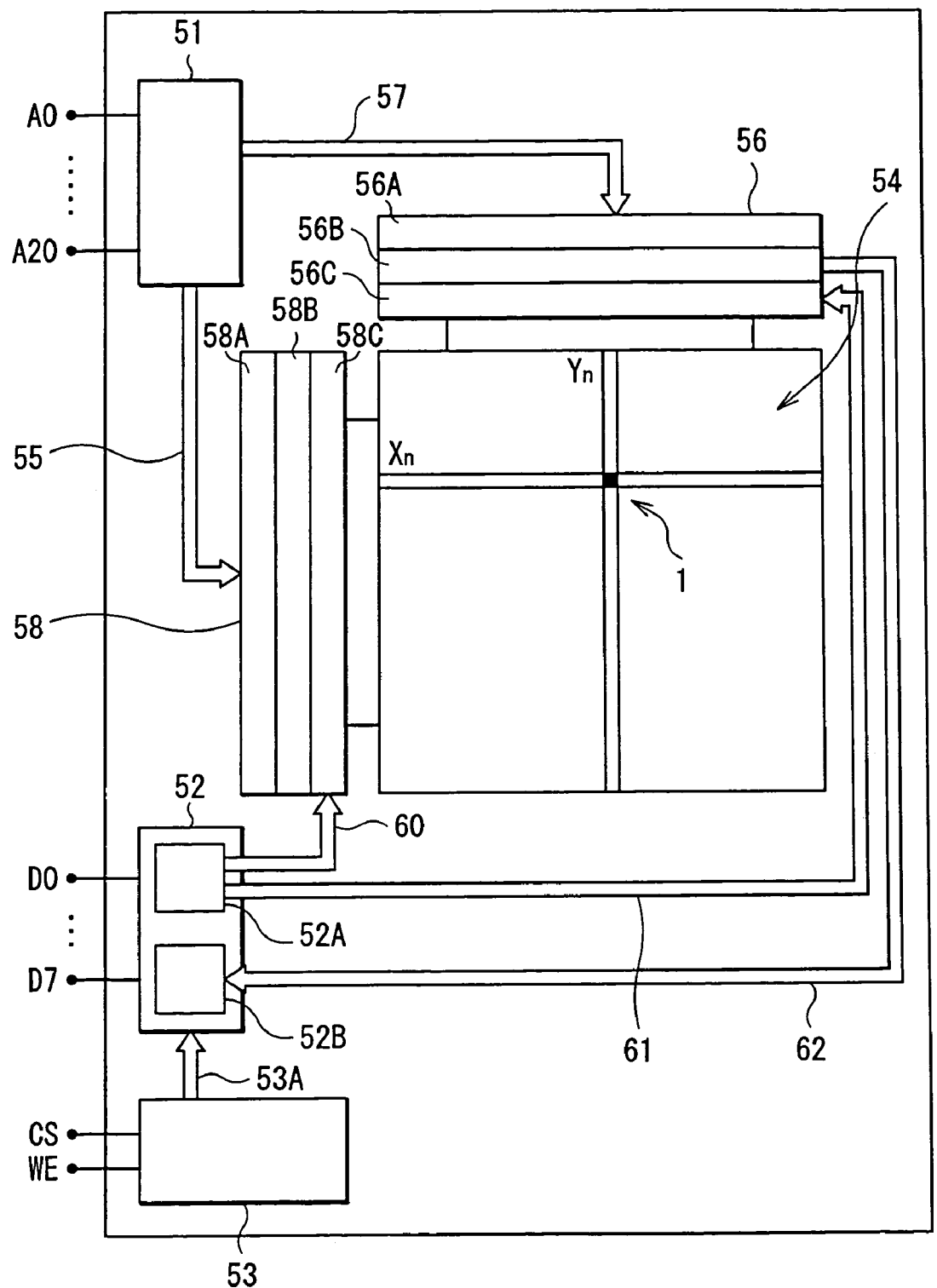
FIG. 1 is a block diagram showing a general configuration of a magnetic memory device according to a first embodiment of the invention.

Embodiments of the invention will now be described in detail hereinbelow by referring to the drawings.

First, by referring to FIGS. 1 to 9, the configuration of a magnetic memory device according to an embodiment of the invention will be described. FIG. 1 is a conceptual diagram showing a general configuration of a magnetic memory device in the embodiment. The magnetic memory device has an address buffer 51, a data buffer 52, a control logic part 53, a memory cell group 54, a first drive control circuit part 56, a second drive control circuit part 58, external address input terminals A0 to A20, and external data terminals D0 to D7.

The memory cell group 54 has a matrix structure in which a number of memory cells 1 each having a pair of tunneling magneto-resistive elements (hereinbelow, called TMR elements) are arranged in a word line direction (X-direction) and a bit line direction (Y-direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit part 56 has an address decoder circuit 56A, a sense amplification circuit 56B, and a current drive circuit 56C in the Y-direction. The second drive control circuit part 58 has an address decoder circuit 58A, a constant current circuit 58B, and a current drive circuit 58C in the X-direction.

The address decoder circuits 56A and 58A are to select a word decode line 72 (which will be described later) and a bit decode line 71 (which will be described later) according to an input address signal. The sense amplification circuit 56B and the constant current circuit 58B are circuits driven at the time of performing reading operation. The current drive circuits 56C and 58C are circuits driven at the time of performing writing operation.

The sense amplification circuit 56B and the memory cell group 54 are connected to each other via a plurality of bit decode lines 71 in which the sense current flows at the time of reading operation. Similarly, the constant current circuit 58B and the memory cell group 54 are connected to each other via a plurality of word decode lines 72 in which the sense current flows at the time of reading operation.

The Y-direction current drive circuit 56C and the memory cell group 54 are connected to each other via write bit lines 5 (which will be described later) necessary at the time of writing operation. Similarly, the X-direction current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit part 56 via a Y-direction address line 57 and the X-direction address decoder circuit 58A in the second drive control circuit part 58 via an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58A by a buffer amplifier (not shown) provided in the address buffer 51. Further, the address buffer 51 functions to divide the amplified address signal into two signals and output the signals to the Y-direction address decoder circuit 56A via the Y-direction address line 57 and to the X-direction address decoder circuit 58A via the X-direction address line 55.

The data buffer 52 is constructed by an input buffer 52A and an output buffer 52B, has the external data terminals D0 to D7, is connected to the control logic part 53, and operates by an output control signal 53A from the control logic part 53. The input buffer 52A is connected to the Y-direction current drive circuit 56C in the first drive control circuit part 56 and the X-direction current drive circuit 58C in the second drive control circuit part 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B by an internally provided buffer amplifier (not shown) and to output the resultant signal with low impedance to the external data terminals D0 to D7.

The control logic part 53 has a chip select terminal CS and a write enable terminal WE and is connected to the data buffer 52. The control logic part 53 functions to receive a signal voltage from the chip select terminal CS for selecting a memory cell to be subject to reading/writing from the group 54 of plural memory cells and a signal voltage from the write enable terminal WE for outputting a write permit signal and to output the output control signal 53A to the data buffer 52.

The configuration related to information writing operation in the magnetic memory device shown in FIG. 1 will now be described.

Figure 2:
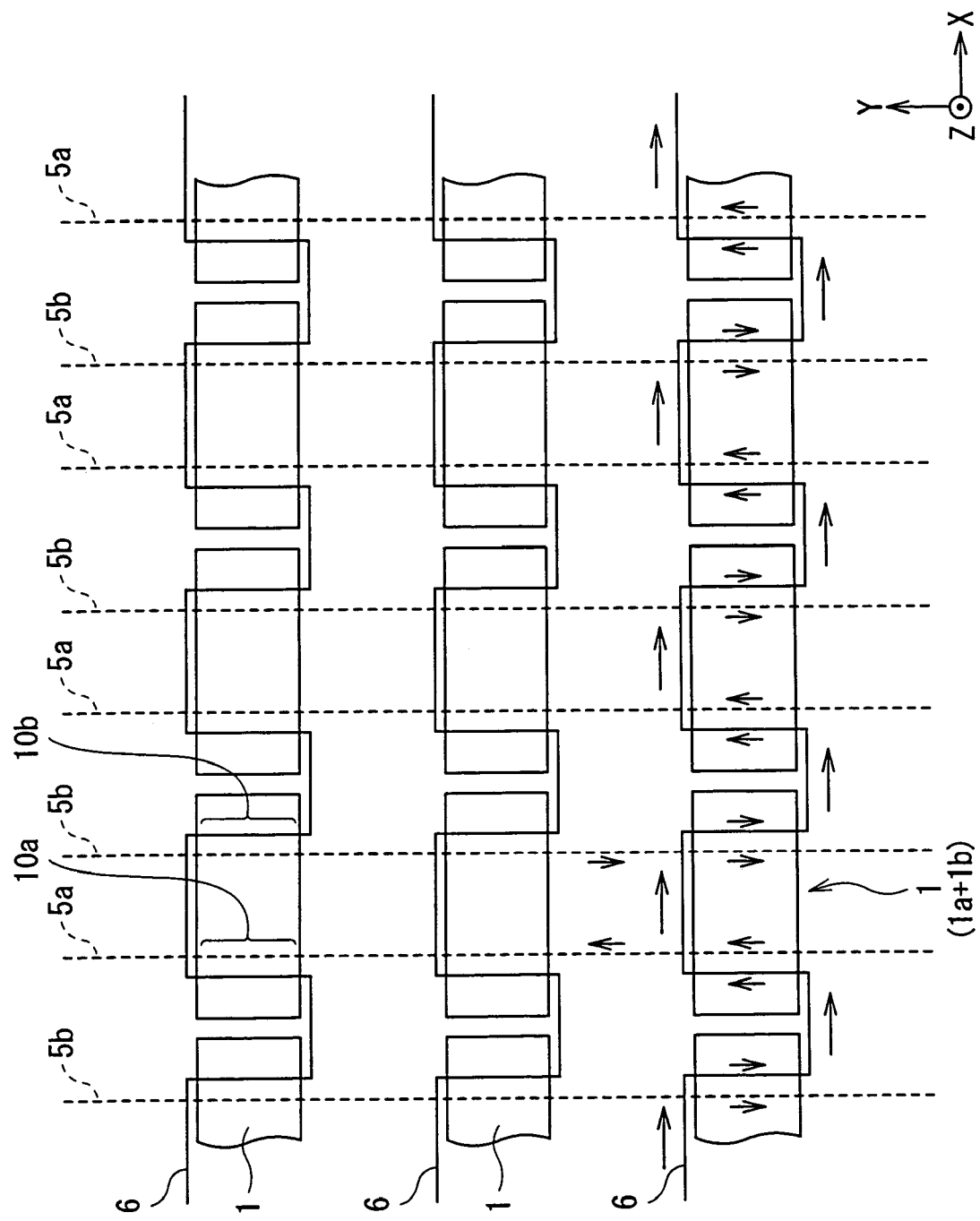
FIG. 2 is a plan view showing the configuration of a write line of the magnetic memory device illustrated in FIG. 1.

FIG. 2 is a conceptual diagram showing a configuration in plan view of a main part related to the writing operation in the memory cell group 54. As shown in FIG. 2, the magnetic memory device of the embodiment includes a plurality of write bit lines 5a and 5b and a plurality of write word lines 6 extending so as to cross the plurality of write bit lines 5a and 5b. Each region where the write bit lines 5a and 5b and the write word line 6 cross each other includes a parallel part 10a in which the write bit line 5a and the write word line 6 extend in parallel with each other and a parallel part 10b in which the write bit line 5b and the write word line 6 extend in parallel with each other. Concretely, as shown in FIG. 2, the write word lines 6 extend in the X-direction in a rectangular wave shape and the write bit lines 5a and 5b extend in the Y-direction alternately and linearly. The rising and falling portions of the rectangular wave shape of the write word line 6 form the plurality of parallel parts 10a and 10b in cooperation with the write bit lines 5a and 5b. The memory cell 1 is provided in each region where the write bit lines 5a and 5b cross the write word line 6 so as to include at least a part of the parallel parts 10a and 10b. The memory cell 1 is constructed by TMR elements 1a and 1b, the TMR element 1a is provided in a region where the write bit line 5a and the write word line 6 cross each other, and the other TMR element 1b is provided in the region where the write bit line 5b and the write word line 6 cross each other. The TMR elements 1a and 1b are a concrete example of "a pair of magneto-resistive elements" of the invention.

To the write bit lines 5a and 5b and the write word line 6, currents from the Y-direction current drive circuit 56C and the X-direction current drive circuit 58C flow. The current flowing in the write bit line 5a and the current flowing in the write bit line 5b are always in the opposite directions. For example, as shown by the arrows in FIG. 2, when the current direction in the write bit lines 5a is set as +Y direction, the current direction in the write bit lines 5b is −Y direction. Therefore, in this case, when the current directions in the write word lines 6 are set as +X direction as a whole (from left to right in the drawing sheet), the direction of current in the write bit line 5a and that in the write word line 6 in the TMR element 1a are parallel with each other. The direction of current in the write bit line 5b and that in the write word line 6 flowing in the other TMR element 1b are also parallel with each other. In the following, if it is unnecessary to discriminate the current directions from each other, the write bit lines 5a and 5b will be simply referred to as the write bit lines 5. The write word line 6 is a concrete example corresponding to a "first write line" of the invention, and the write bit line 5 is a concrete example corresponding to a "second write line" of the invention.

Figure 3:
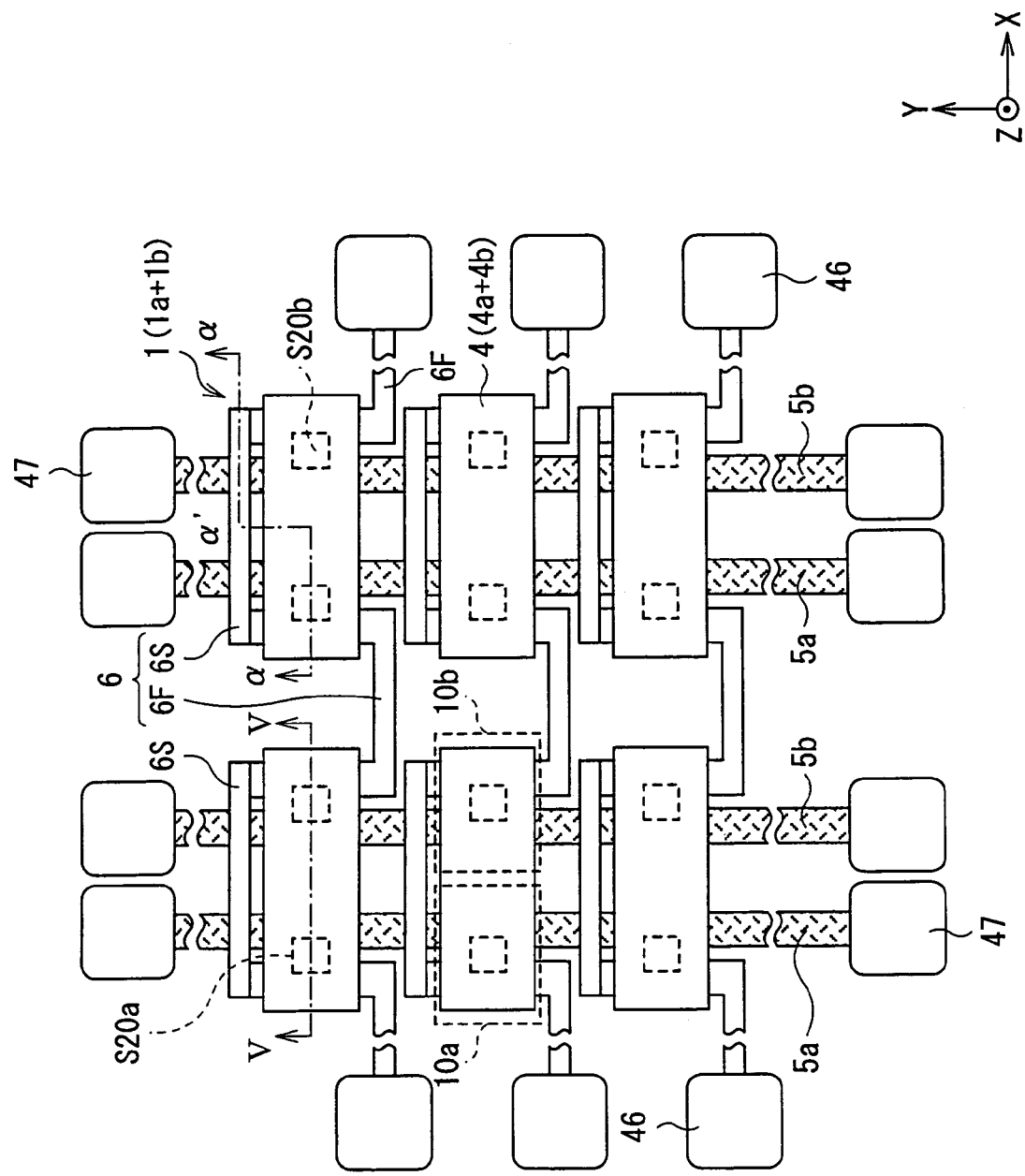
FIG. 3 is a partial plan view showing the configuration of a main part of a memory cell group in the magnetic memory device illustrated in FIG. 1.

FIG. 3 shows the configuration in plan view of the main part of the memory cell group 54 illustrated as a conceptual diagram of FIG. 2 more specifically. The write bit lines 5a and 5b, write word lines 6, and memory cells 1 (TMR elements 1a and 1b) shown in FIG. 3 correspond to those in FIG. 2. The TMR elements 1a and 1b are disposed in the parallel parts 10a and 10b of the write bit lines 5a and 5b and the write word lines 6. The TMR elements 1a and 1b have stacked bodies S20a and S20b each including a magneto-sensitive layer and the magnetic yokes 4a and 4b, respectively, and the magnetization direction of the magneto-sensitive layer changes according to the magnetic field generated by the currents flowing in the write bit lines 5a and 5b and the write word lines 6 in the parallel parts 10a and 10b (that is, the external magnetic field in the magnetic yokes 4a and 4b). The write word line 6 is constructed by including two parts of a part of a first level 6F provided in the same layer as the write bit lines 5a and 5b (the first level L1 which will be described later) and a part of a second level 6S formed in a second level L2 (which will be described later) different from the first level L1. The part of the first level 6F and the part of the second level 6S are electrically connected to each other via a connection layer 6T (not shown in FIG. 3) made of a conductive material such as aluminum (Al) or copper (Cu). With the configuration, the write word line 6 is provided over the write bit lines 5a and 5b extending in the Y-direction along the X-direction and functions as a single conductor extending in the X-direction as a whole. In this case, the write bit lines 5a and 5b in the parallel parts 10a and 10b and the part of the first level 6F in the write word line 6 are provided in the first level L1 including the same XY plane and are electrically insulated from each other. The part of the second level 6S is a concrete example corresponding to a "connection conductor" of the invention.

At both ends of each write bit line 5, write bit line lead electrodes 47 are provided. One end of each of the write bit line lead electrodes 47 is connected to the Y-direction current drive circuit 56C and the other end is connected so as to be finally grounded. Similarly, write word line lead electrodes 46 are provided at both ends of each write word line 6. One end of each of the write word line lead electrodes 46 is connected to the X-direction current drive circuit 58C and the other end is connected so as to be finally grounded.

Figure 4:
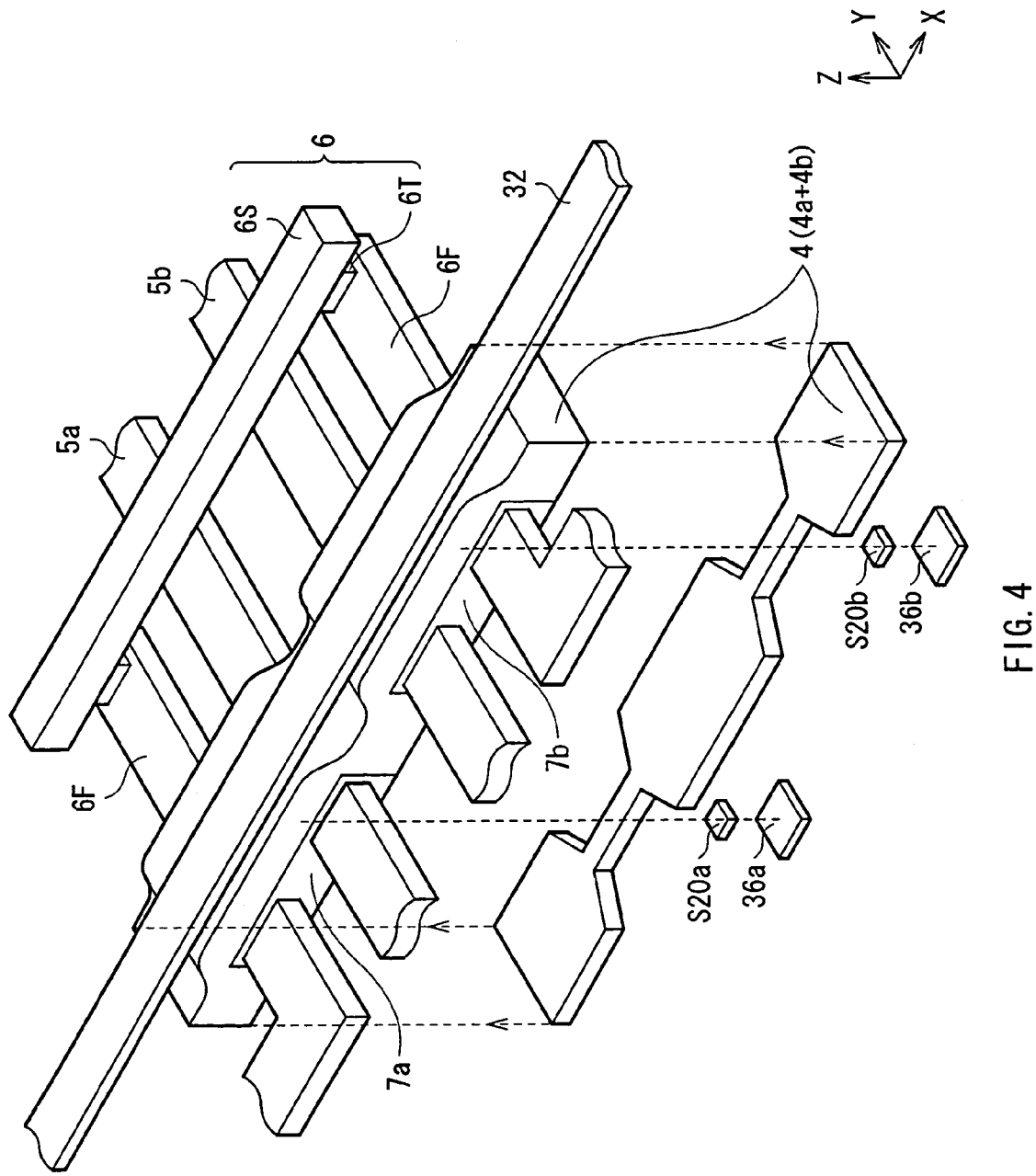
FIG. 4 is a perspective view showing the configuration of a main part of the memory cell group in the magnetic memory device illustrated in FIG. 1.
Figure 5:
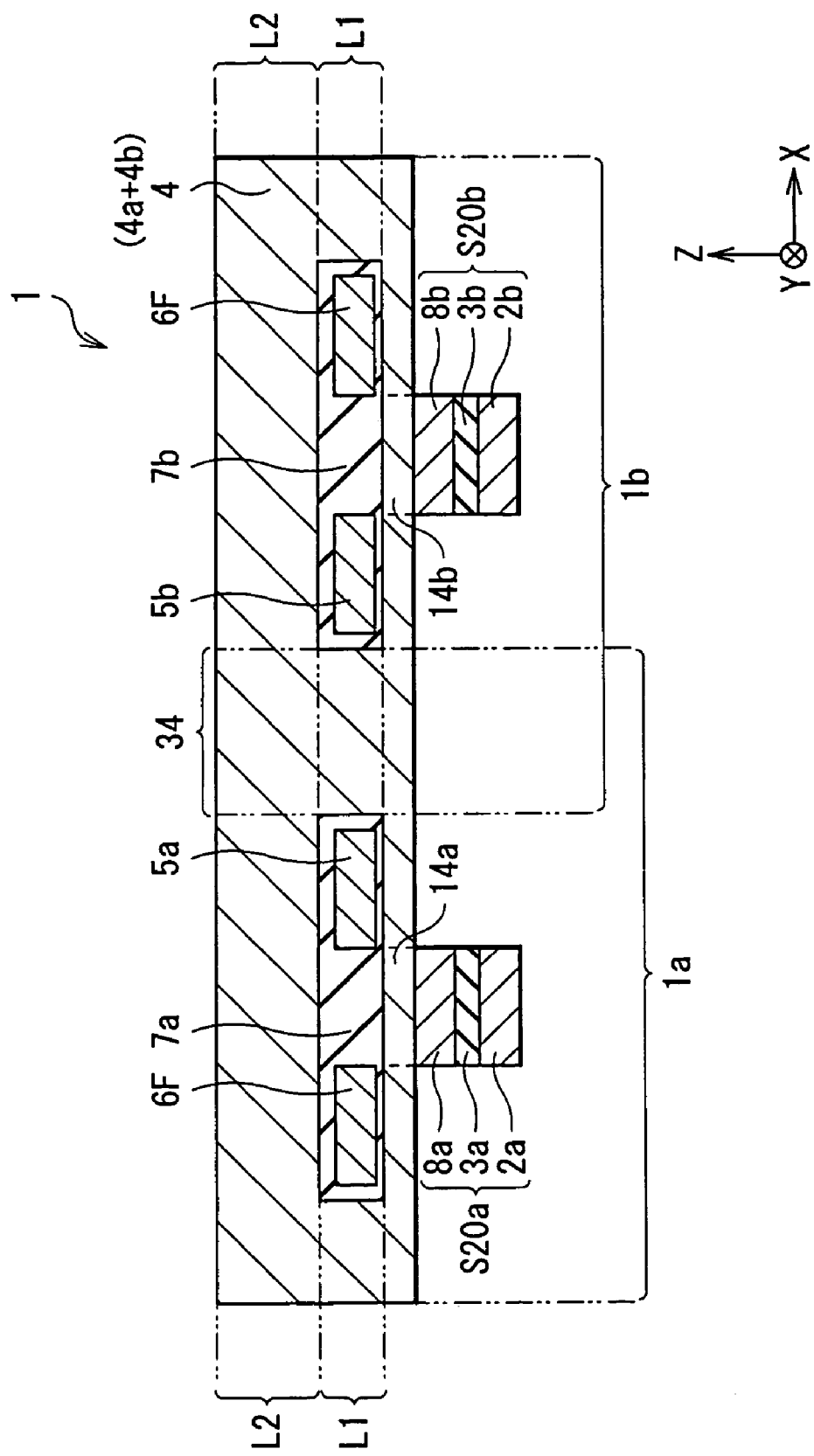
FIG. 5 is a cross section showing the configuration in a plane taken along line V—V of the magnetic memory cell illustrated in FIG. 3.
Figure 6:
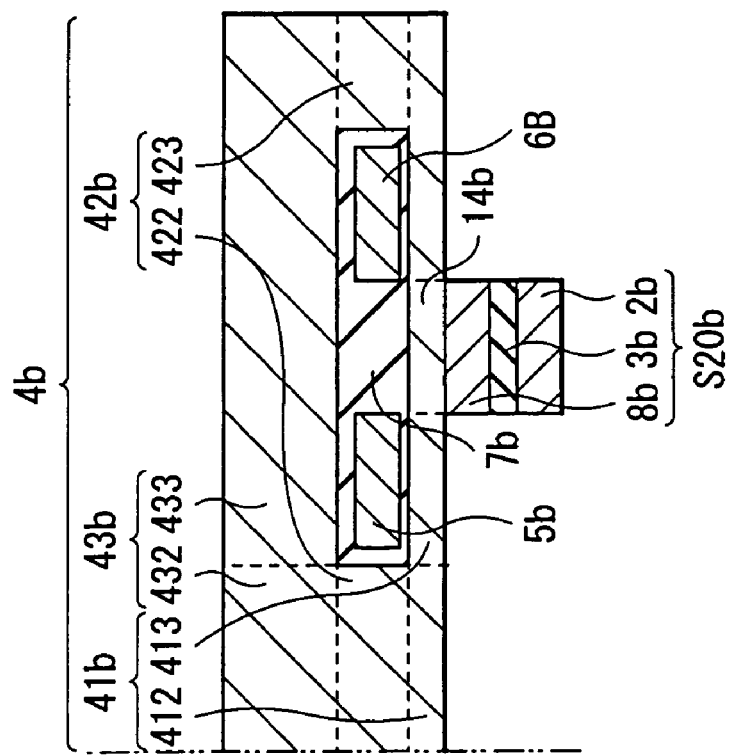
FIG. 6 is a cross section showing a state where the magnetic memory cell illustrated in FIG. 5 is conceptually divided in two TMR elements.
Figure 6:
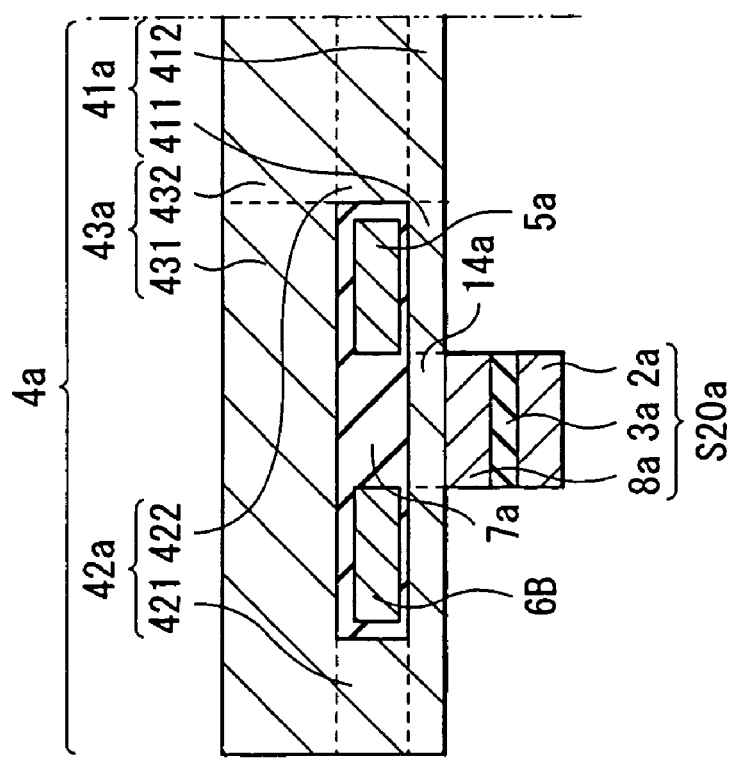

FIG. 4 is an enlarged perspective view of the memory cell 1. FIG. 5 shows a schematic sectional configuration of the memory cell 1 taken along line V—V of FIG. 3. FIG. 6 shows the memory cell 1 of FIG. 5A which is conceptually divided into the TMR element 1a and the TMR element 1b. FIGS. 5 and 6 are schematic diagrams for clarifying the configuration of detailed parts. The size ratio and shape of the memory cell 1 shown in FIGS. 5 and 6 do not always coincide with those shown in FIG. 4.

As shown in FIGS. 4 to 6, the memory cell 1 has the pair of TMR elements 1a and 1b including the magnetic yokes 4a and 4b and the stacked bodies S20a and S20b, respectively. The write bit lines 5a and 5b and write word line 6 (part of the first level 6F) are disposed so as to be adjacent to each other in the first level L1 parallel with the stacked layer surface of the stacked bodies S20a and S20b in the region surrounded by the magnetic yokes 4a and 4b (FIG. 5). The write word line 6 (part of the first level 6F), write bit lines 5a and 5b, and magnetic yokes 4a and 4b are electrically insulated from each other via insulating films 7a and 7b. The stacked bodies S20a and S20b are formed on the surface parallel with the direction of arranging the write word line 6 (part of the first level 6F) and the write bit lines 5a and 5b, in the outer surface of the magnetic yokes 4a and 4b. The stacked bodies S20a and S20b are electrically connected to conductive layers 36a and 36b (which will be described later) formed on the side opposite to the magnetic yokes 4a and 4b in the Z-direction. The pair of conductive layers 36a and 36b is a part of a pair of Schottky diodes 75a and 75b (which will be described later) and each of the other end of the Schottky diodes 75a and 75b is connected to the read bit lines 33a and 33b (which will be described later) extending in the Y-direction. The Schottky diodes 75a and 75b are buried in a substrate 31 (which will be described later). On the face opposite to the face on which the stacked bodies S20a and S20b are formed of the magnetic yokes 4a and 4b, a read word line 32 is provided so as to extend in the X-direction.

The TMR element 1a in the memory cell 1 has: the magnetic yoke 4a disposed in correspondence with the area (parallel part 10a) where the write bit line 5a and the write word line 6 cross each other and disposed along the circumferential direction so as to surround the periphery of the write bit line 5a and the part of the first level 6F; and the stacked body S20a including a second magnetic layer 8a as a magneto-sensitive layer of which magnetization direction changes according to an external magnetic field, magnetically coupled to the magnetic yoke 4a, and constructed so that current flows in the direction perpendicular to the stacked face. The other TMR element 1b has: the magnetic yoke 4b disposed in correspondence with the area (parallel part 10b) where the write bit line 5b and the write word line 6 cross each other and disposed along the circumferential direction so as to surround the periphery of the write bit line 5b and the write word line 6; and the stacked body S20b including a second magnetic layer 8b as a magneto-sensitive layer of which magnetization direction changes according to an external magnetic field, is magnetically coupled to the magnetic yoke 4b, and constructed so that current flows in the direction perpendicular to the stacked face. The TMR elements 1a and 1b share a common part 34 as a part of the magnetic yokes 4a and 4b.

As shown in FIGS. 5 and 6, the stacked bodies S20a and S20b are TMR films including, in order from the side of the magnetic yokes 4a and 4b, the second magnetic layers 8a and 8b, tunnel barrier layers 3a and 3b, and first magnetic layers 2a and 2b whose magnetization direction is fixed, and are constructed so that current flows in the direction perpendicular to the stacked face. In FIGS. 5 and 6, to clarify the configuration of the stacked bodies S20a and S20b, the stacked bodies S20a and S20b are exaggerated so as to be larger relative to the peripheral parts. The second magnetic layers 8a and 8b as magneto-sensitive layers (also called free magnetization direction layers) are magnetically exchange-coupled with connection parts 14a and 14b as part of the magnetic yokes 4a and 4b.

When the magnetization directions of the pair of TMR elements 1a and 1b are inverted in the directions which are not parallel with each other, in the common part 34, the directions of current magnetic fields generated by the write bit lines 5a and 5b and the write word line 6 become the same and the magnetic flux density increases. Consequently, the current magnetic field can be used more efficiently, and the current necessary to invert the magnetization directions of the magnetic yokes 4a and 4b and the second magnetic layers 8a and 8b can be further decreased. Since a part of the magnetic yoke 4 is shared, the pair of TMR elements 1a and 1b can be easily formed, the formation area of the memory cell 1 can be reduced, and capacity of stored information can be increased.

In the stacked bodies S20a and S20b, when a voltage is applied in the direction perpendicular to the stacked face between the first magnetic layers 2a and 2b and the second magnetic layers 8a and 8b, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin in the first magnetic layers 2a and 2b in the interface with the tunnel barrier layer 3 and the spin in the second magnetic layers 8a and 8b. Specifically, when the spin of the first magnetic layers 2a and 2b and that of the second magnetic layers 8a and 8b are parallel with each other, the resistance value becomes the minimum. When they are antiparallel with each other, the resistance value becomes the maximum. By using the resistance values, the magneto-resistance change ratio (MR ratio) is defined as Equation (1).

$$MR\ ratio = dR/R \qquad (1)$$

where "dR" denotes the difference between the resistance value in the case where the spins are parallel with each other and that in the case where the spins are not parallel with each other, and "R" indicates the resistance value in the case where the spins are parallel with each other.

The resistance value against the tunnel current (hereinbelow, called tunnel resistance Rt) strongly depends on the thickness T of the tunnel barrier layer 3. In a low voltage region, as shown in Equation (2), the tunnel resistance Rt exponentially increases with the thickness T of the tunnel barrier layer 3.

$$Rt \propto \exp(2_\chi T), _\chi = \{8\pi^2 m^*(\phi \cdot Ef)^{0.5}\}/h \qquad (2)$$

where $\phi$ denotes the height of the barrier, "m*" denotes effective mass of electrons, "Ef" indicates Fermi energy, and h indicates a Planck's constant. Generally, in a memory element using the TMR element, to match with a semiconductor device such as a transistor, it is said that the proper tunnel resistance Rt is about tens $k\Omega \cdot (\mu m)^2$. However, to realize higher packing density in the magnetic memory device and higher operating speed, the tunnel resistance Rt is set to, preferably, 10 $k\Omega \cdot (\mu m)^2$ or less, more preferably, 1 $k\Omega \cdot (\mu m)^2$ or less. Therefore, to realize the tunnel resistance Rt, it is desirable to set the thickness T of the tunnel barrier layer 3 to 2 nm or less, more preferably, 1.5 nm or less.

By reducing the thickness T of the tunnel barrier layers 3a and 3b, the tunnel resistance Rt can be reduced but on the other hand, a leak current occurs due to roughness of the junction interfaces with the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b have a coercive force differential structure and the coercive force of the first magnetic layers 2a and 2b is larger than that of the second magnetic layers 8a and 8b. Concretely, the coercive force of the first magnetic layer 2 is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by undesirable magnetic fields such as external scattered magnetic fields or the like. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel with each other since the magnetization direction of the first magnetic layers 2a and 2b and that of the second magnetic layers 8a and 8b are stabilized in a parallel or antiparallel state.

The magnetic yokes 4a and 4b extend so as to annularly surround at least a part of the parallel parts 10a and 10b in the write bit lines 5a and 5b and the write word line 6 and are constructed so that a return magnetic field is generated in the magnetic yokes 4a and 4b by current flowing in the parallel parts 10a and 10b. More specifically, as shown in FIG. 6, the magnetic yoke 4a includes: a pair of pillar yokes 42a (421 and 422) extending in the direction (Z-direction) orthogonal to the stacked layer face of the stacked body S20a while facing each other over the write bit line 5a and the part of the first level 6F; a first beam yoke 41a connected to one end on the side of the stacked body S20a of each of the pair of pillar yokes 42a (421 and 422); and a second beam yoke 43a connected to the other end of each of the pair of pillar yokes 42a (421 and 422). The magnetic yoke 4a has a closed sectional shape. The other magnetic yoke 4b includes: a pair of pillar yokes 42b (422 and 423) extending in the direction (Z-direction) orthogonal to the stacked layer face of the stacked body S20b while facing each other over the write bit line 5b and the part of the first level 6F; a first beam yoke 41b connected to one end on the side of the stacked body S20b of each of the pair of pillar yokes 42b (422 and 423); and a second beam yoke 43b connected to the other end of each of the pair of pillar yokes 42b (422 and 423). The magnetic yoke 4b also has a closed sectional shape. The first beam yoke 41a has an inherent region 411 and a common region 412, and the other first beam yoke 41b has an inherent region 413 and a common region 412. The pair of pillar yokes 42a has the inherent pillar yoke 421 and the common pillar yoke 422. The other pair of pillar yokes 42b has the inherent pillar yoke 423 and the common pillar yoke 422. The second beam yoke 43a has an inherent region 431 and a common region 432. The other second beam yoke 43b has an inherent region 433 and the common region 432. The TMR elements 1a and 1b share the common region 412 of the first beam yokes 41a and 41b, the pillar yoke 422 shared by the pillar yokes 42a and 42b, and the common region 432 of the second beam yokes 43a and 43b, and the common part 34 is formed as shown in FIG. 5. The second beam yokes 43a and 43b are provided in the second level L2 at which the part of the second level 6S is also provided.

The magnetization direction of each of such magnetic yokes 4a and 4b is inverted by the above-described return magnetic field generated on the inside. In this case, mainly, the second magnetic layers 8a and 8b function as storage layers for storing information. The magnetic yokes 4a and 4b are made of, for example, a metal containing at least one of nickel (Ni), iron (Fe), and cobalt (Co), and the second magnetic layers 8a and 8b have a coercive force larger than that of the magnetic yokes 4a and 4b. Consequently, even in the case where the magnetization directions of the magnetic yokes 4a and 4b become unstable due to undesirable external magnetic fields in a state where no write current flows in the write bit lines 5a and 5b and write word line 6 (nonwriting operation state), the magnetization direction of the second magnetic layers 8a and 8b is not influenced and is stably held.

Preferably, the coercive force of the connection parts 14a and 14b in the magnetic yokes 4a and 4b is smaller than that of the first magnetic layers 2a and 2b within the range of $(100/4\pi) \times 10^3$ A/m or less for the following reason. When the coercive force exceeds $(100/4\pi) \times 10^3$ A/m, there is the possibility that the stacked bodies S20a and S20b themselves as the TMR films deteriorate due to heat generation caused by increase in write current. Further, when the coercive force of the connection parts 14a and 14b is equal to or larger than that of the first magnetic layers 2a and 2b, the write current increases, the magnetization direction of the first magnetic layers 2a and 2b as the magnetization fixed layer changes, and the stacked bodies S20a and S20b as storage elements are destroyed. To make the current magnetic fields by the write bit lines 5a and 5b and the write word line 6 concentrated on the magnetic yokes 4a and 4b, the magnetic permeability of the magnetic yokes 4a and 4b is preferably high. Concretely, the magnetic permeability is preferably 2000 or higher and, more preferably, 6000 or higher.

Each of the write bit lines 5a and 5b and the part of the first level 6F has a structure in which, for example, a film of titanium (Ti) having a thickness of 10 nm, a film of titanium nitride (TiN) having a thickness of 10 nm, and a film of aluminum (Al) having a thickness of 500 nm are sequentially stacked. The part of the second level 6S and the connection layer 6T are made of the same kind of material, for example, NiFe as that of the magnetic yokes 4a and 4b. The write bit line 5 and the write word line 6 are not limited to have the above configuration but may be made of at least one of aluminum (Al), copper (Cu), and tungsten (W). The details of operation of writing information to the memory cell 1 by using the write bit line 5 and the write word line 6 will be described later.

As described above, the magnetic memory device of the embodiment has a simpler configuration in the layer stack direction since the write bit lines 5a and 5b and the write word line 6 are disposed so as to be adjacent to each other at the first level L1 parallel with the layer stack face of the stacked bodies S20a and S20b in the region surrounded by the magnetic yokes 4a and 4b.

Figure 7:
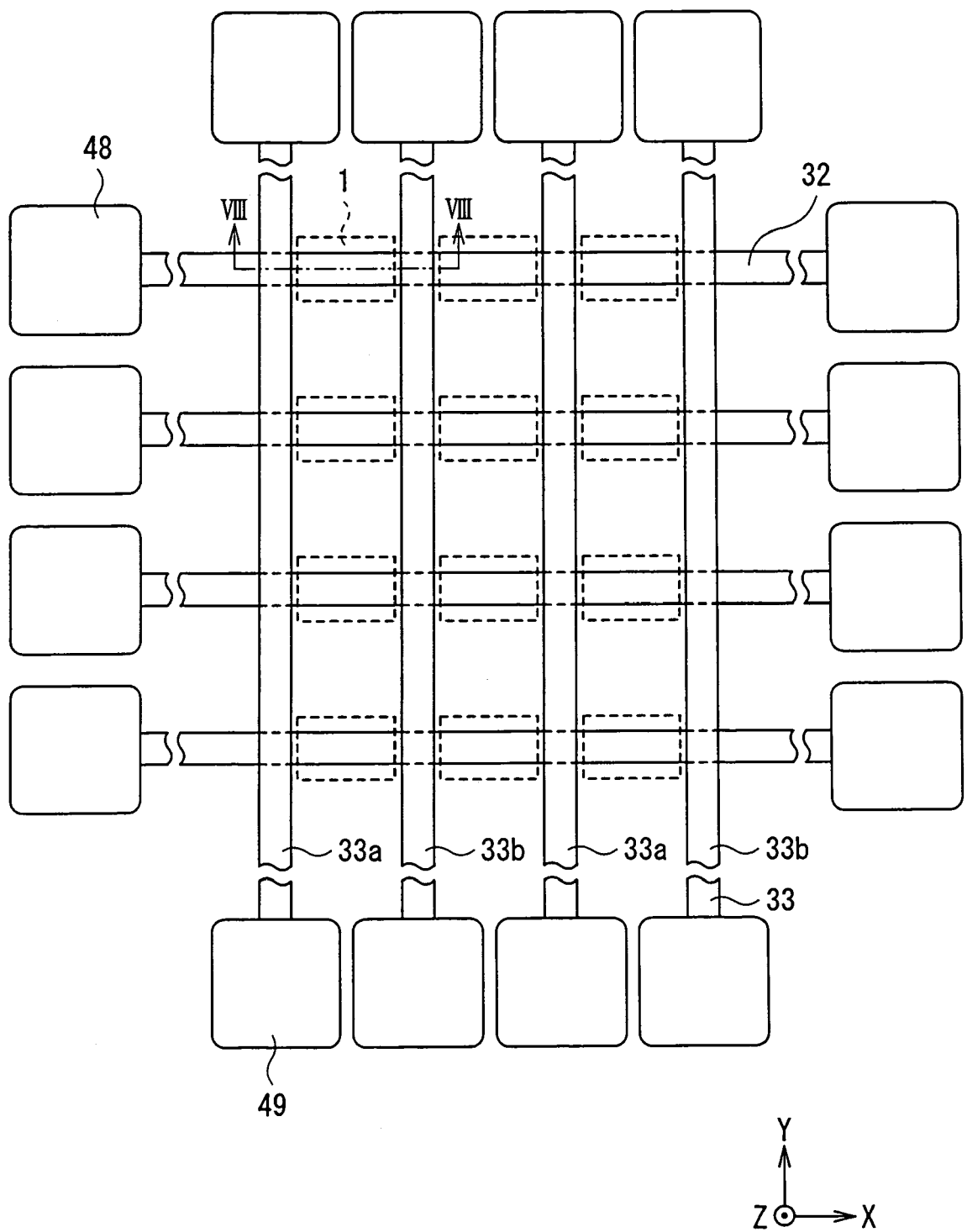
FIG. 7 is another partial plan view showing the configuration of the main part of the memory cell group in the magnetic memory device illustrated in FIG. 1.
Figure 8:
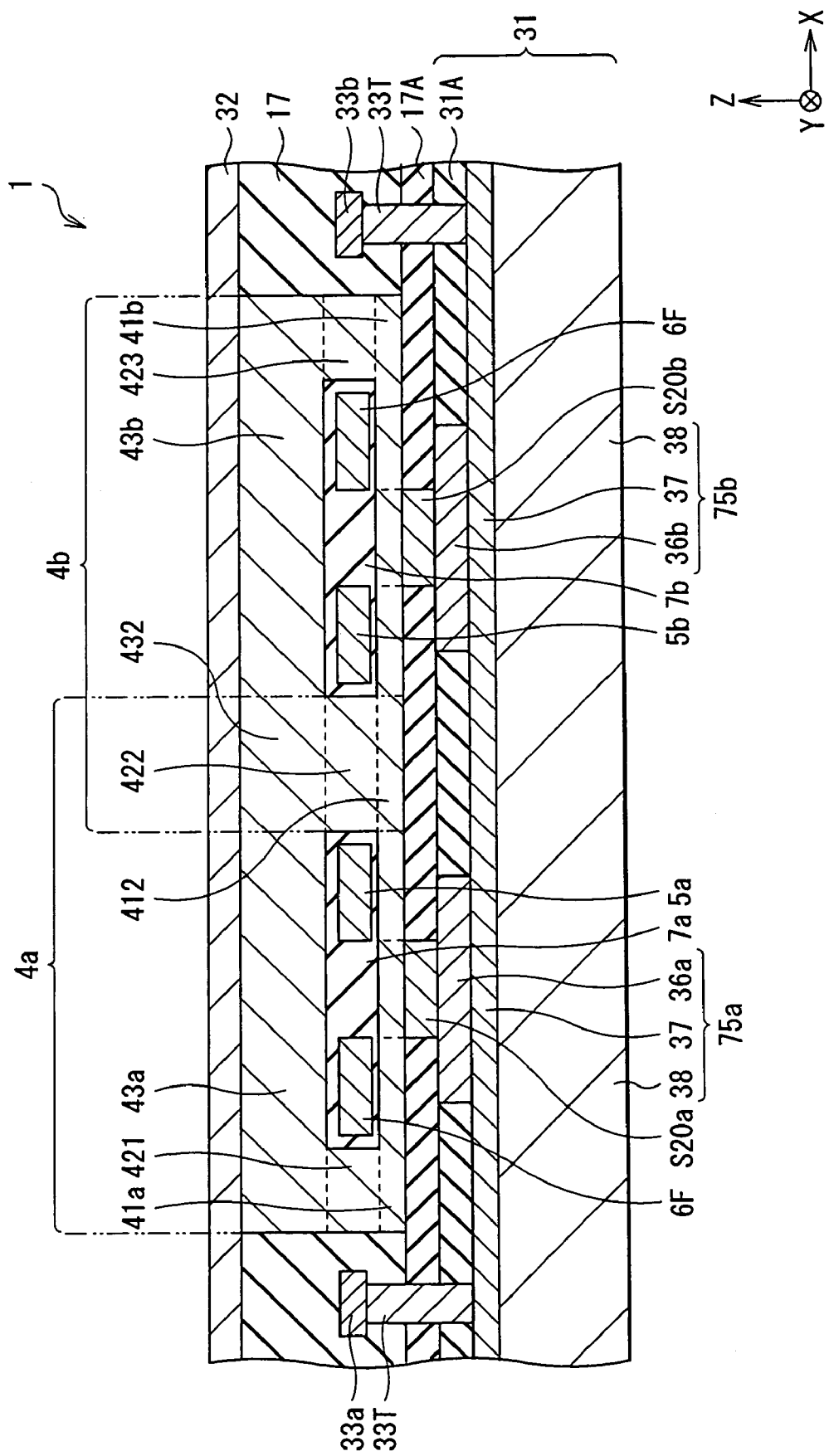
FIG. 8 is a cross section showing the configuration in a plane taken along line VIII—VIII of the memory cell illustrated in FIG. 7.

The configuration related to information reading operation, in the magnetic memory device shown in FIG. 1 will now be described by referring to FIGS. 7 and 8. FIG. 7 is a plan view showing the configuration of a main part related to the reading operation of the memory cell group 54 and corresponds to FIG. 3. FIG. 8 is a cross section taken along line VIII—VIII of FIG. 7.

As shown in FIG. 7, each memory cell 1 is disposed at each of the intersecting points of the plurality of read word lines 32 and the plurality of read bit lines 33a and 33b in the XY plane. The stacked bodies S20a and S20b on the under face of the memory cell 1 are in contact with the pair of read bit lines 33a and 33b via the pair of Schottky diodes 75a and 75b, and the top face (the side opposite to the stacked bodies S20a and S20b) is in contact with the read word line 32. The read bit lines 33a and 33b supply read current to the pair of TMR elements 1a and 1b in each memory cell 1, and the read word line 32 leads the read current passed to the TMR elements 1a and 1b to the ground. At both ends of each read bit line 33, read bit line lead electrodes 49 are provided. On the other hand, at both ends of each read word line 32, read bit line lead electrodes 48 are provided.

As shown in FIG. 8, the magnetic memory device of the embodiment is constructed so that, in a region including the memory cell 1, the pair of stacked bodies S20a and S20b and the magnetic yokes 4a and 4b are sequentially formed over the substrate 31 provided with the Schottky diode 75 (hereinbelow, simply called diode 75) functioning as a rectifier.

The pair of diodes 75a and 75b have the conductive layers 36a and 36b, an epitaxial layer 37, and a substrate 38 in order from the side of the stacked bodies S20a and S20b. Between the conductive layers 36a and 36b and the epitaxial layer 37, a Schottky barrier is formed. The conductive layers 36a and 36b are in contact with the stacked bodies S20a and S20b in a part of the face on the side opposite to the epitaxial layer 37, and the other part is surrounded by the insulating layers 31A and 17A. The diodes 75a and 75b are connected to the annular magnetic layer 4 via the stacked bodies S20a and S20b and, except for this, do not have parts electrically connected to each other. The substrate 38 is an $n^-$ type silicon wafer. Generally, in the $n^-$ type silicon wafer, an impurity of phosphorus (P) is diffused. As the substrate 38, a wafer of an $n^{++}$ type obtained by being highly doped with phosphorus is used. In contrast, as the epitaxial layer 37, a wafer of the $n^-$ type obtained by being lightly doped with phosphorus is used. By making the epitaxial layer 37 as an $n^-$ type semiconductor and the conductive layers 36a and 36b made of a metal come into contact with each other, a band gap is created and a Schottky barrier is formed. Further, the pair of diodes 75a and 75b are connected to the read bit lines 33a and 33b, respectively, via a connection layer 33T.

Figure 9:
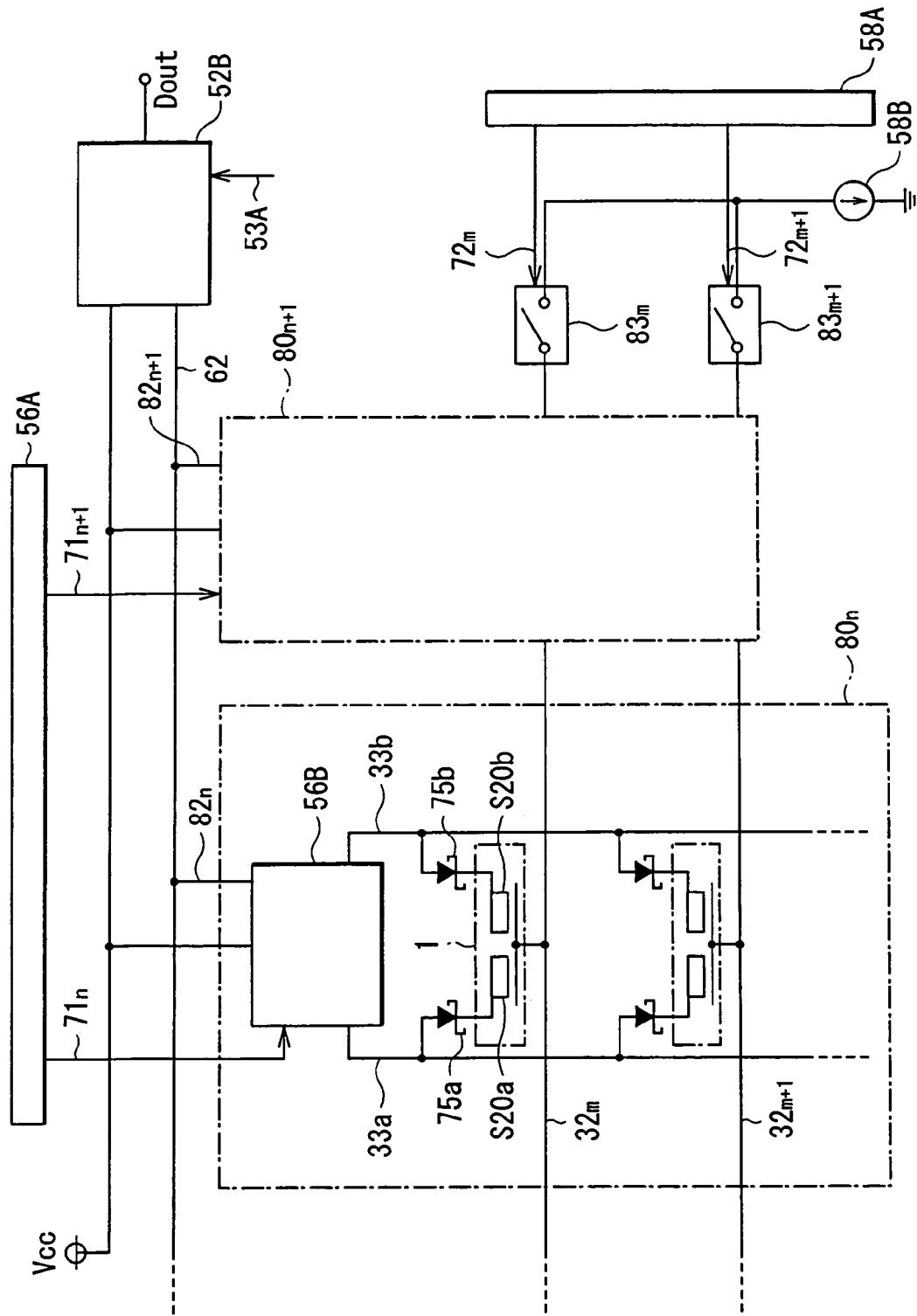
FIG. 9 is a circuit diagram showing the circuit configuration of the magnetic memory device illustrated in FIG. 1.

Referring now to FIG. 9, the circuit configuration related to the reading operation in the magnetic memory device of the embodiment will be described.

FIG. 9 is a configuration diagram of a circuit system constructed by the memory cell group 54 and a read circuit. In the read circuit system, the memory cell 1 is of a differential amplifier type constructed by the pair of TMR elements 1a and 1b. Information in the memory cell 1 is read by outputting a differential value of read currents passed to the TMR elements 1a and 1b (currents passed from the read bit lines 33a and 33b to the TMR elements 1a and 1b and output to the common read word line 32).

In FIG. 9, a unit read circuit 80 ( . . . , 80n, 80n+1, . . . ) as a unit of repetition of the read circuit is constructed by the memory cells 1 of each bit line in the memory cell group 54 and a part of the read circuit including the sense amplification circuit 56B, and the unit read circuits 80n are arranged in the bit line direction. Each of the unit read circuits 80n is connected to the Y-direction address decoder circuit 56A via the bit decode line 71 ( . . . , 71n, 71n+1, . . . ) and is connected to the output buffer 52B via the Y-direction read data bus 62.

In the memory cell group 54, the read word lines 32 ( . . . , 32m, 32m+1, . . . ) arranged in the X-direction and the pair of read bit lines 33a and 33b arranged in the Y-direction are disposed in a matrix. Each of the memory cells 1 is disposed in a position intersecting with the read word line 32 in a region sandwiched by the pair of read bit lines 33a and 33b. One end of each of the TMR elements 1a and 1b in each memory cell 1 is connected to the read bit lines 33a and 33b via the pair of diodes 75a and 75b, respectively, and the other ends are connected to the common read word line 32.

One end of each read word line 32 is connected to a read switch 83 ( . . . , $83_m$, $83_{m+1}$, . . . ) via the read word line lead electrode 48 and is also connected to a common constant current circuit 58B. Each read switch 83 is connected to the X-direction address decoder circuit 58A via the word decode line 72 ( . . . , $72_m$, $72_{m+1}$, . . . ). The read switch 83 is made conductive when a selection signal from the X-direction address decoder circuit 58A is supplied. The constant current circuit 58B has the function of making the current flowing in the read word line 32 constant.

One end of each read bit line 33 is connected to the sense amplification circuit 56B via the read bit line lead electrode 49, and the other end is finally grounded. One sense amplification circuit 56B is provided per unit read circuit 80 and has the function of receiving the potential difference between the pair of read bit lines 33a and 33b in each unit read circuit 80 and amplifying the potential difference. Each of the sense amplification circuits 56B is connected to the output line 82 ( . . . , 82n, 82n+1, . . . ) and is finally connected to the output buffer 52B via the Y-direction read data bus 62.

The operation in the magnetic memory device of the embodiment will now be described.

Figure 10A:
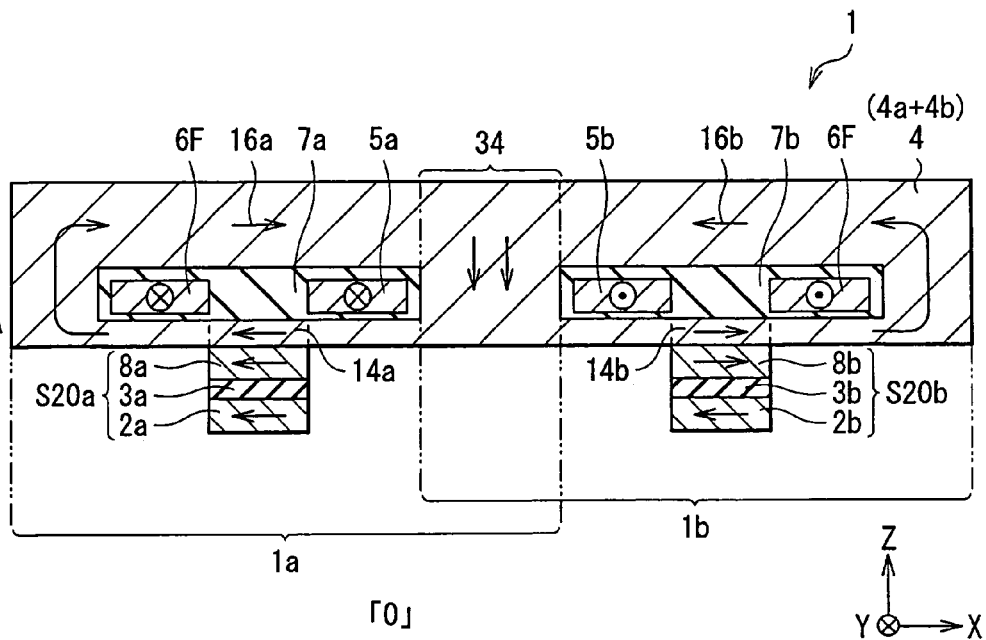
FIG. 10A is a first explanatory diagram showing the relation between a write current direction and a return magnetic field direction (magnetization direction) in the sectional configuration of the magnetic memory cell illustrated in FIG. 5.
Figure 10B:
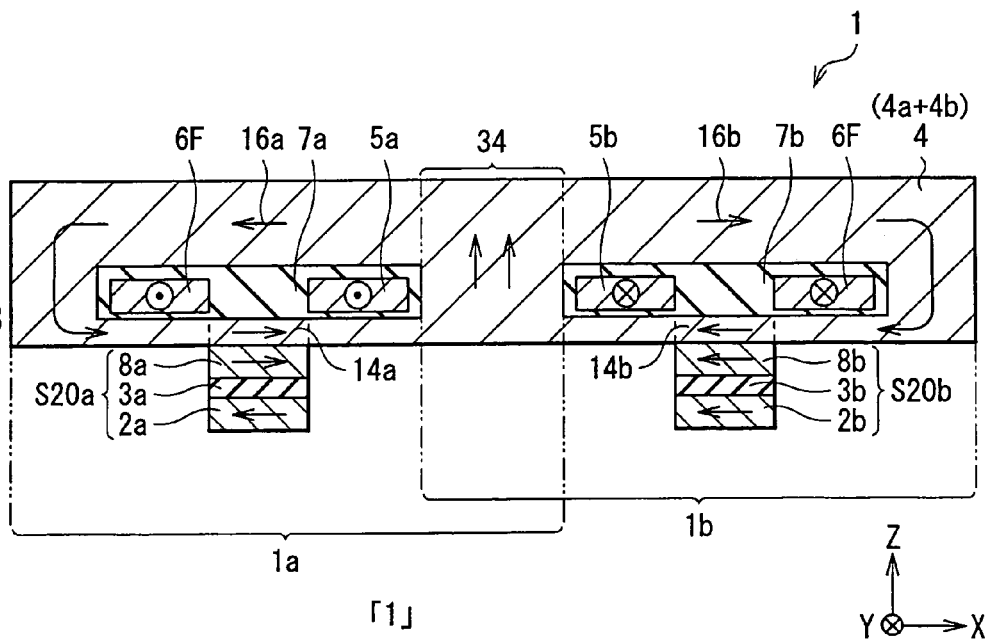
FIG. 10B is a second explanatory diagram showing the relation between the write current direction and the return magnetic field direction (magnetization direction) in the sectional configuration of the magnetic memory cell illustrated in FIG. 5.

Referring now to FIG. 2 and FIGS. 10A and 10B, the operation of writing information into the memory cell 1 will be described. FIGS. 10A and 10B express the relation between the write current direction and the return magnetic field direction (magnetization direction) in the sectional configuration of the memory cell 1 shown in FIG. 5. The arrows indicated in magnetic layers in FIGS. 10A and 10B indicate the magnetization directions of the magnetic layers. With respect to the magnetic yokes 4a and 4b, the magnetic field directions of a magnetic path formed on the inside are also shown. The magnetization of the first magnetic layers 2a and 2b is fixed to the −X direction. FIGS. 10A and 10B show the case where write current flows in the same direction to the write bit line 5 and the write word line 6 which extend in the memory cell 1 and are parallel with each other. FIG. 10A corresponds to the write current direction shown in FIG. 2. FIG. 10A shows a case where write current flows from this side to the depth in the direction perpendicular to the drawing sheet (in the +Y direction) in the TMR element 1a and a return magnetic field 16a is generated in the clockwise direction in the magnetic yoke 4a of the portion surrounding the write bit line 5a and the part of the first level 6F, and also a case where write current flows from the depth to this side in the direction perpendicular to the drawing sheet (in the −Y direction) in the TMR element 1b, and the return magnetic field 16b is generated in the counterclockwise direction in the magnetic yoke 4b of the portion surrounding the write bit line 5b and the part of the first level 6F. In this case, the magnetization direction of the connection part 14a and the second magnetic layer 8a is the −X direction and the magnetization direction of the connection part 14b and the second magnetic layer 8b is the +X direction. FIG. 10B corresponds to the case where the directions of current flowing in the write bit line 5 and the part of the first level 6F are opposite to those shown in FIG. 10A. Specifically, FIG. 10B shows a case where write current flows from the depth to this side in the direction perpendicular to the drawing sheet (in the −Y direction) in the TMR element 1a, the return magnetic field 16a is generated in the counterclockwise direction in the magnetic yoke 4a of the portion surrounding the write bit line 5a and the part of the first level 6F, write current flows from this side to the depth in the direction perpendicular to the drawing sheet (in the −Y direction) in the TMR element 1b, and the return magnetic field 16b is generated in the clockwise direction in the magnetic yoke 4b of the portion surrounding the write bit line 5b and the part of the first level 6F. In this case, the magnetization direction of the connection part 14a and the second magnetic layer 8a is the +X direction, and the magnetization direction of the connection part 14b and the second magnetic layer 8b is the −X direction.

In the cases of FIGS. 10A and 10B, the current direction of the write bit line 5a and the part of the first level 6F penetrating the TMR element 1a and that of the write bit line 5b and the part of the first level 6F penetrating the TMR element 1b are opposite to each other. Consequently, the directions of the return magnetic fields 16a and 16b flowing in the pillar yoke 422 (refer to FIG. 6) corresponding to the common part 34 of the magnetic yokes 4a and 4b can be made the same (the −Z direction in FIG. 10A and the +Z direction in FIG. 10B).

As obvious from FIGS. 10A and 10B, according to the directions of the return magnetic field 16a and 16b generated by the currents flowing in the write bit line 5 and the write word line 6 penetrating the magnetic yokes 4a and 4b, the magnetization direction of the connection part 14a and the second magnetic layer 8a and that of the connection part 14b and the second magnetic layer 8b change so as to be opposite to each other. By using the phenomenon, information can be stored in the memory cell 1.

In short, when current flows in the same direction in the write bit lines 5 and the write word line 6, the magnetization directions of the magnetic yokes 4a and 4b are inverted and, accompanying the inversion, the magnetization directions of the second magnetic layers 8a and 8b change, thereby enabling binary information of "0" or "1" to be stored. In the case where "0" corresponds to, for example, the state of FIG. 10A, specifically, the state where the connection part 14a and the second magnetic layer 8a are magnetized in the −X direction and the other connection part 14b and the second magnetic layer 8b are magnetized in the +X direction, "1" corresponds to the state of FIG. 10B, specifically, the state where the connection part 14a and the second magnetic layer 8a are magnetized in the +X direction and the other connection part 14b and the second magnetic layer 8b are magnetized in the −X direction. In such a manner, information can be stored.

In this case, in the TMR elements 1a and 1b, when the magnetization direction of the first magnetic layers 2a and 2b and that of the second magnetic layers 8a and 8b are the parallel, a low resistance state in which large tunnel current flows is obtained. When they are antiparallel, a high resistance state in which only small tunnel current flows is obtained. That is, one of the pair of TMR elements 1a and 1b is always in the low resistance state and the other is in the high resistance state, thereby storing information. In the case where the write currents flow in the opposite directions in the write bit lines 5a and 5b and the write word line 6 or in the case where the write current flows in only one of the write bit line 5 and the write word line 6, the magnetization directions of the second magnetic layers 8a and 8b are not inverted and the data is not rewritten.

In the memory cell 1 in the magnetic memory device of the embodiment having the configuration as described above, by passing the currents in the same direction to both of the write bit lines 5a and 5b and the write word line 6, the direction of the current magnetic field generated by the write bit lines 5a and 5b and that of the current magnetic field generated by the write word line 6 become the same in the magnetic yokes 4a and 4b, so that a synthetic magnetic field can be generated. Consequently, as compared with the case where the magnetic yokes 4a and 4b are not provided and the case where the write bit lines 5a and 5b and the write word line 6 perpendicularly cross each other, higher magnetic flux density is obtained. Thus, the current magnetic field can be used more efficiently and the current necessary to invert the magnetization in the second magnetic layers 8a and 8b can be reduced.

Further, since the second magnetic layers 8a and 8b are provided between the tunnel barrier layers 3a and 3b and the connection parts 14a and 14b of the magnetic yokes 4a and 4b, the following advantages are obtained. Exchange coupling between the connection parts 14a and 14b and the second magnetic layers 8a and 8b can be realized and the magnetization direction in the second magnetic layers 8a and 8b is aligned more excellently, so that more stable writing can be performed. Further, the coercive force of the connection parts 14a and 14b can be further suppressed, so that a heat generation amount can be decreased by reducing the current value in the writing operation, and the functions of the magnetic memory device can be fully displayed.

In the magnetic memory device of the embodiment, as described above, by passing current to both of the write bit lines 5a and 5b and the write word line 6, a closed magnetic circuit can be formed. Consequently, magnetization in the magnetic yokes 4a and 4b in the TMR elements 1a and 1b can be inverted efficiently, and the magnetic influences on memory cells adjacent to the memory cell 1 to be subject to writing can be reduced. Further, by the shield effect of the magnetic yokes 4a and 4b, the intervals of neighboring memory cells on the substrate can be narrowed. Thus, the invention has the advantage of realizing higher integration and higher packing density of the magnetic memory device.

Referring now to FIGS. 1, 9, 11A, and 11B, the reading operation in the magnetic memory device of the embodiment will be described.

First, one of the plurality of bit decode lines 71 is selected by the address decoder circuit 56A in the first drive control circuit part 56 and a control signal is transmitted to the corresponding sense amplification circuit 56B. As a result, read current flows in the read bit lines 33a and 33b and the positive potential is given to the side of the stacked bodies S20a and S20b in the TMR elements 1a and 1b. Similarly, by the X-direction address decoder circuit 58A in the second drive control circuit part 58, one of the plurality of word decode lines 72 is selected and the read switch 83 in the corresponding part is driven. The selected read switch 83 is made conductive, read current flows in the corresponding read word line 32, and a negative potential is applied to the side opposite to that of the stacked bodies S20a and S20b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read.

Figure 11A:
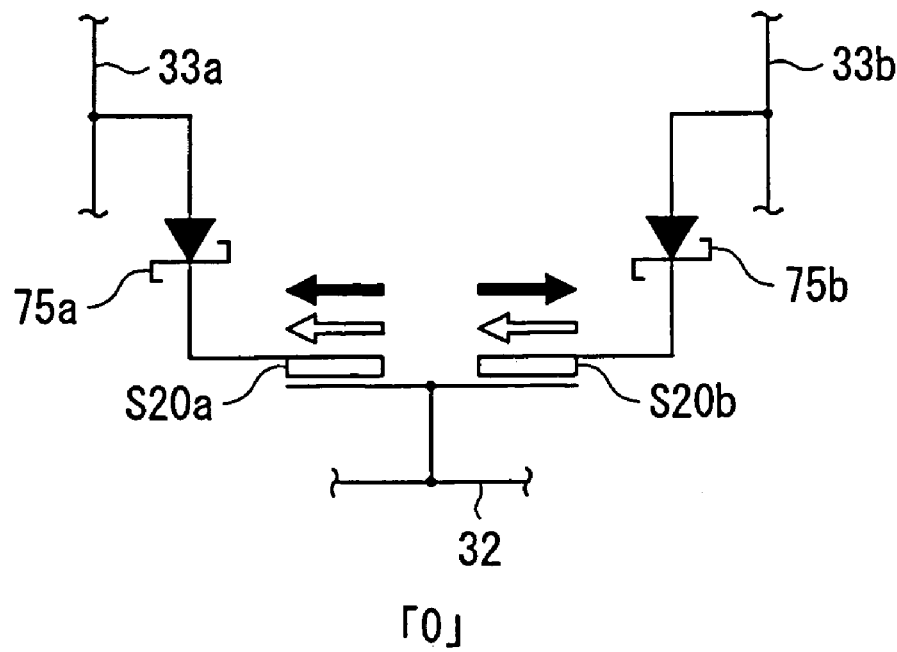
FIG. 11A is a first partial enlarged view of the circuit configuration illustrated in FIG. 9.
Figure 11B:
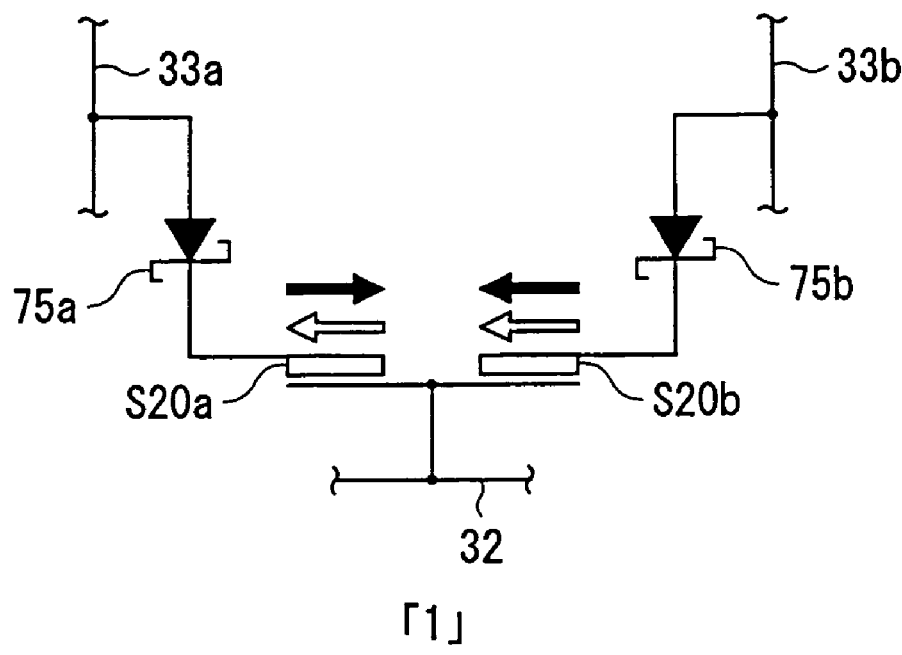
FIG. 11B is a second partial enlarged view of the circuit configuration illustrated in FIG. 9.

FIGS. 11A and 11B are circuit diagrams each showing a portion around the memory cell 1. The magnetization directions of the first magnetic layers 2a and 2b in the stacked bodies S20a and S20b are indicated by hollow arrows and those of the second magnetic layers 8a and 8b are indicated by solid arrows. Both of the magnetization directions of the first magnetic layers 2a and 2b are fixed to the left directions. In FIG. 11A, the magnetization direction of the first magnetic layer 2a and that in the second magnetic layer 8a in the stacked body S20a are the same, and the magnetization direction of the first magnetic layer 2b and that of the second magnetic layer 8b in the other stacked body S20b are opposite to each other. In this case, the stacked body S20a is in the low resistance state, and the stacked body S20b is in the high resistance state. This case corresponds to, for example, "0". In the other case of FIG. 11B, different from the case of FIG. 11A, the stacked body S20a is in the high resistance state and the stacked body S20b is in the low resistance state. This case corresponds to, for example, "1". Such binary information can be obtained by utilizing the fact that the resistance values of the stacked bodies S20a and S20b are different from each other and detecting the difference between the current values.

A method of manufacturing the magnetic memory device of the embodiment having the configuration as described above will now be explained.

A method of manufacturing the magnetic memory device of the embodiment includes: a stacked body forming process of forming the pair of stacked bodies S20a and S20b on the substrate 31 provided with the pair of diodes 75a and 75b; a lower yoke forming process for forming the lower yoke 4B so as to cover at least the pair of stacked bodies S20a and S20b; a write line forming process for simultaneously forming the pair of the parts of the first level 6F and the write bit lines 5a and 5b so as to be disposed adjacent to each other in the first level L1 including the same plane parallel with the stacked layer face of the stacked bodies S20a and S20b via the insulating film 7A as a first insulating film on the lower yoke 4B; and a magnetic yoke forming process for forming the pair of magnetic yokes 4a and 4b disposed along the circumferential direction so as to surround the pair of write word lines 6B and the write bit lines 5a and 5b in cooperation with the lower yoke 4B by providing the upper yoke 4U via the insulating film 7B as a second insulating film around the pair of the parts of the first level 6F and the write bit lines 5a and 5b, and partially sharing each other. The method will be described in detail hereinbelow by referring to the drawings.

A method of manufacturing, mainly, the memory cell 1 in the magnetic memory device will be concretely described hereinbelow with reference to FIGS. 12 to 19. FIGS. 12 to 19 are cross sections taken along line α-α'-α shown in FIG. 3 and show manufacturing processes in order.

Figure 12:
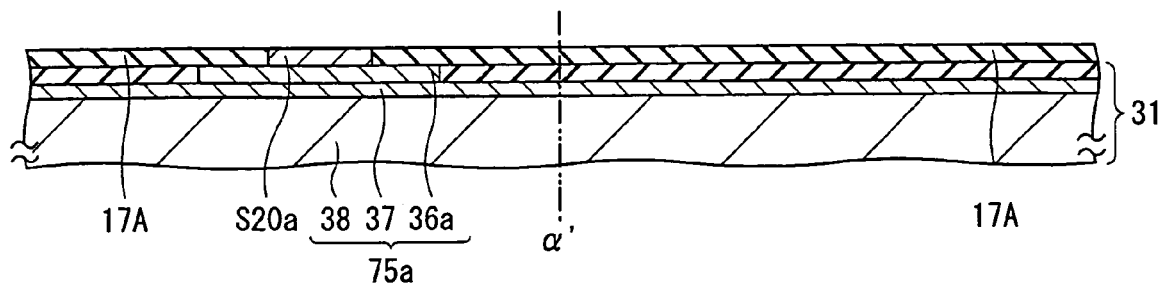
FIG. 12 is an enlarged cross section showing a process in a method of manufacturing the magnetic memory device illustrated in FIG. 1.
Figure 13:
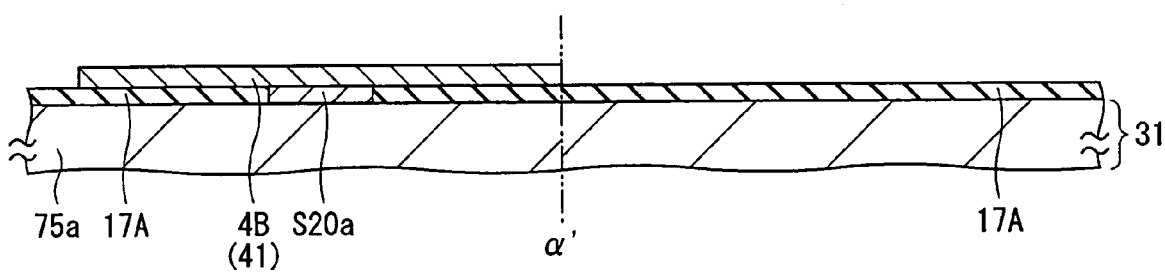
FIG. 13 is an enlarged cross section showing a process subsequent to FIG. 12.

In the first process, the lower yoke 4B (the first beam yokes 41a and 41b) is formed over the substrate 31 via the stacked bodies S20a and S20b. First, as shown in FIG. 12, the substrate 31 in which the diodes 75a and 75b are buried and on which the stacked bodies S20a and S20b and the insulating film 17A surrounding the stacked bodies S20a and S20b and its periphery are already formed is prepared. In FIGS. 13 to 19 subsequent to FIG. 12, the details of the substrate 31 will be omitted. Subsequently, as shown in FIG. 13, a metal film made of NiFe is formed by, for example, sputtering on the entire surface. After that, the metal film is subjected to milling so as to leave the region corresponding to the stacked bodies S20a and S20b, thereby obtaining the lower yoke 4B.

Figure 14:
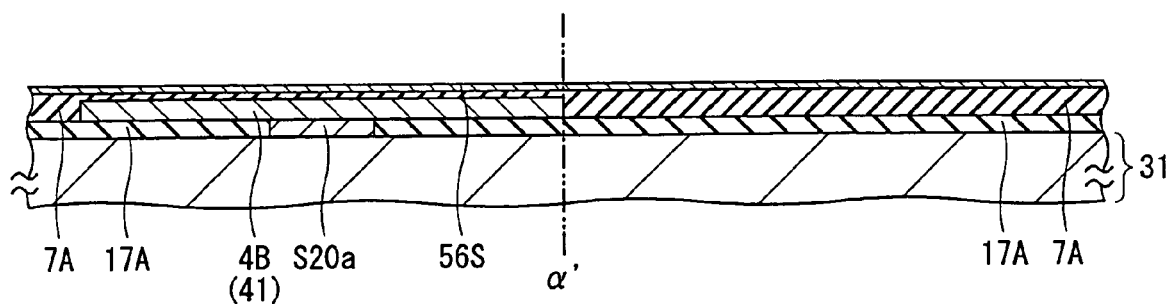
FIG. 14 is an enlarged cross section showing a process subsequent to FIG. 13.
Figure 15:
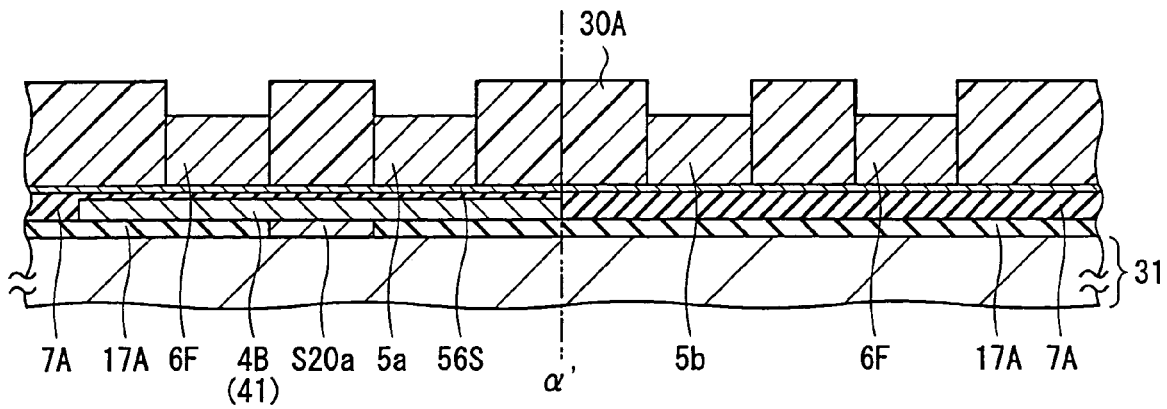
FIG. 15 is an enlarged cross section showing a process subsequent to FIG. 14.
Figure 16:
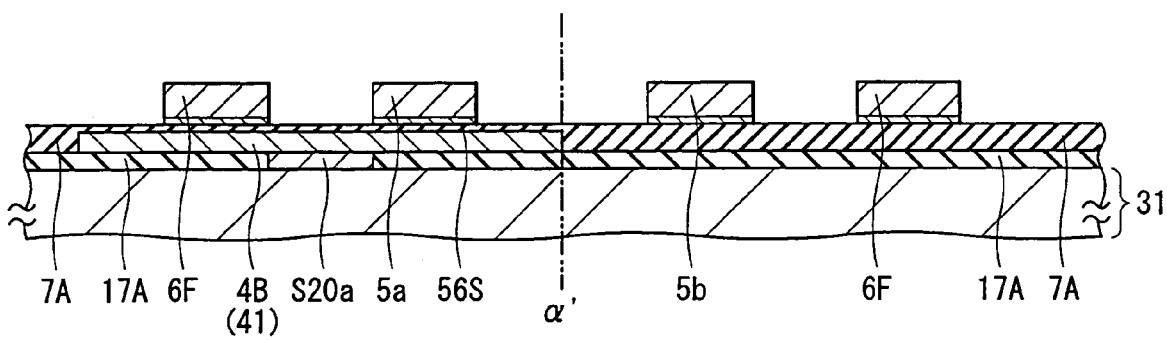
FIG. 16 is an enlarged cross section showing a process subsequent to FIG. 15.

In the following second process, the write bit lines 5a and 5b and the part of the first level 6F are formed so as to be adjacent to each other in the first level L1. In this case, first, as shown in FIG. 14, the insulating film 7A and an underplating film 56S are sequentially formed on the entire surface. Concretely, for example, the insulating film 7A made of aluminum oxide ($Al_2O_3$) or the like by using a CVD apparatus and the underplating film 56S made of a conductive material such as copper is formed by, for example, sputtering. After that, as shown in FIG. 15, a resist pattern 30A is selectively formed on the underplating film 56S. In this case, the resist pattern 30A is formed so as not to cover the regions in which the write bit lines 5a and 5b and the part of the first level 6F are to be formed. After that, the resultant is soaked in a plating bath and a plating process using the underplating film 56S as an electrode is performed, thereby simultaneously forming the write bit lines 5a and 5b and the part of the first level 6F. After the plating process, as shown in FIG. 16, the resist pattern 30A is removed and the exposed underplating film 56S is removed by milling or the like. Generally, such a thin film patterning method is called a frame plating method.

Figure 17:
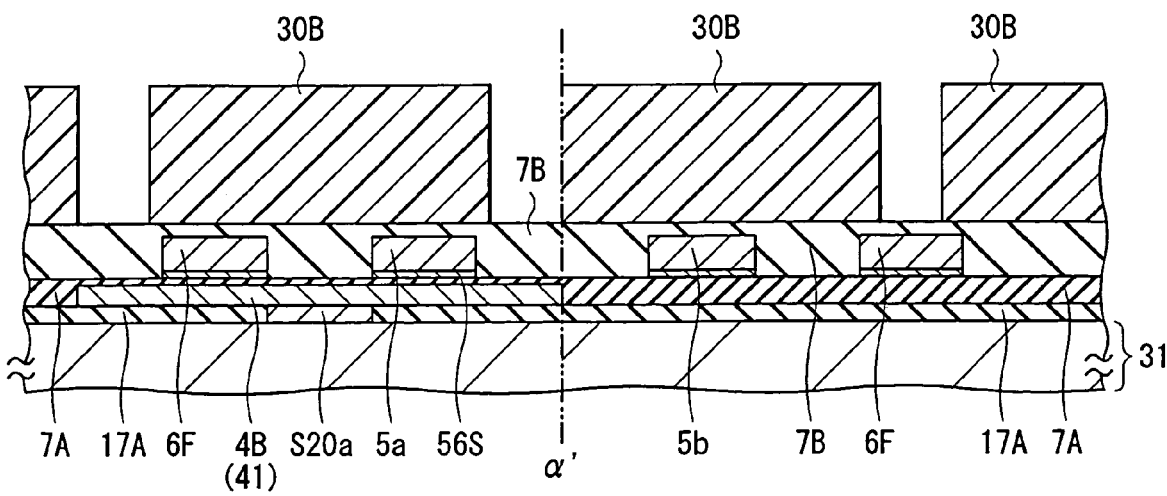
FIG. 17 is an enlarged cross section showing a process subsequent to FIG. 16.
Figure 18:
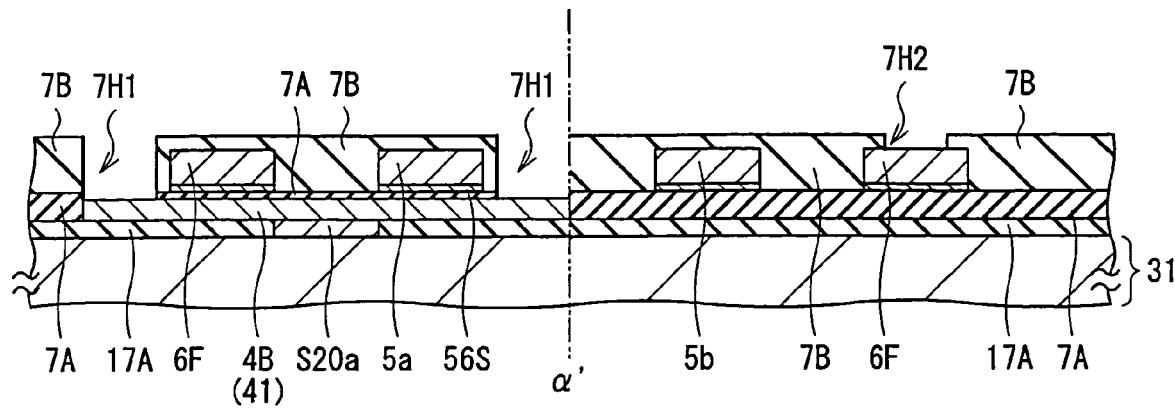
FIG. 18 is an enlarged cross section showing a process subsequent to FIG. 17.
Figure 19:
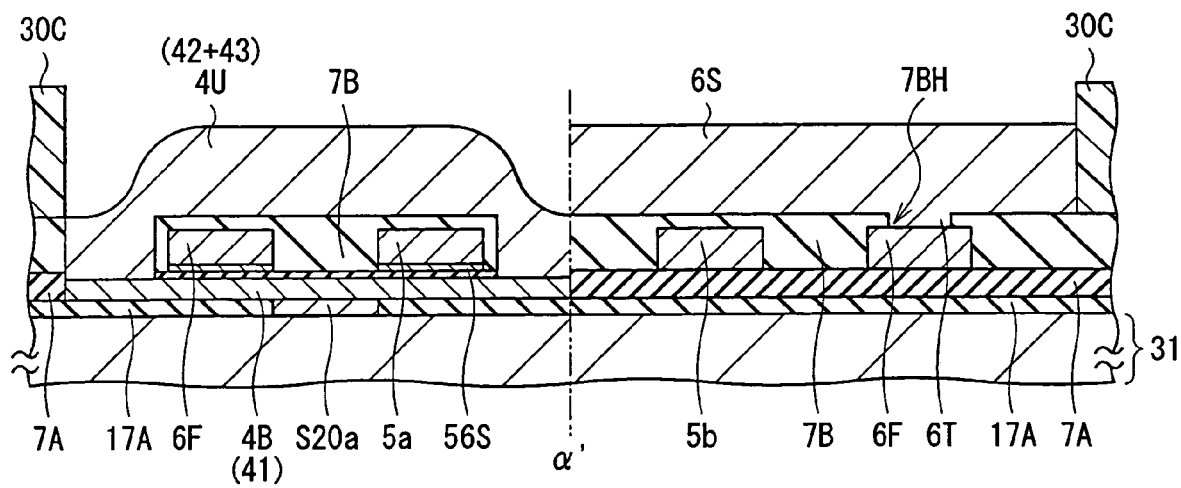
FIG. 19 is an enlarged cross section showing a process subsequent to FIG. 18.

In the following third process, the upper magnetic yoke 4U (specifically, the pair of pillar yokes 42 and the second beam yoke 43) and the part of the second level 6S are formed. First, as shown in FIG. 17, an insulating film 7B made of, for example, $Al_2O_3$ is formed so as to cover the entire face by sputtering or the like and, after that, a resist pattern 30B is selectively formed on the insulating film 7B. Concretely, the resist pattern 30B is formed so as not to cover both sides of the regions in which the write bit lines 5a and 5b and the part of the first level 6F are formed in the region in which the lower yoke 4B is formed, and a partial region corresponding to the part of the first level 6F in the region in which the lower yoke 4B is not formed. After that, the resist pattern 30B is used as a mask, and the insulating films 7A and 7B in non-protect regions are removed by reactive ion etching (RIE) or the like. By the operation, as shown in FIG. 18, through holes 7H1 and 7H2 are formed, regions in which the lower yoke 4B is exposed appear on both sides of the written bit lines 5a and 5b and the part of the first level 6F both covered with the insulating film 7B, and a region in which a part of the part of the first level 6F is exposed appears. After that, as shown in FIG. 19, a resist pattern 30C in a predetermined shape is formed and a plating process using the resist pattern 30C as a frame is performed, thereby enabling the upper yoke 4U and the part of the second level 6S to be formed simultaneously in the second level L2. By the operation, formation of the magnetic yoke 4 and the write word line 6 is completed and the memory cell 1 is completed. After completion of the magnetic cell 1, the read word line 32 having a desired width is formed so as to be electrically connected to the upper yoke 4U.

After that, the write word line lead electrodes 46 are formed at both ends of the write word line 6, the write bit line lead electrodes 47 are formed at both ends of the write bit line 5, the read word line lead electrodes 48 are formed at both ends of the read word line 32 and, further, the read bit line lead electrodes 49 are formed at both ends of the read bit line 33.

In such a manner, formation of the memory cell group 54 including the memory cells 1 is completed.

Further, by performing a process of forming a protection layer made of silicon oxide ($SiO_2$), $Al_2O_3$, or the like by a sputtering apparatus, a CVD apparatus, or the like and a process of polishing the protection layer to expose the lead electrodes 46 to 49, manufacture of the magnetic memory device is completed.

As described above, the method of manufacturing a magnetic memory device of the embodiment includes the step of simultaneously forming the write bit lines 5a and 5b and the part of the first level 6F. Consequently, as compared with the case where the write bit lines 5a and 5b and the part of the first level 6F are formed separately, the memory cell 1 can be formed by the smaller number of processes. In particular, the magnetic yoke forming step includes a step of simultaneously forming the part of the second level 6S and the upper magnetic yoke 4U in a region other than the region surrounded by the magnetic yokes 4a and 4b, so that the manufacturing process can be further simplified.

Figure 20:
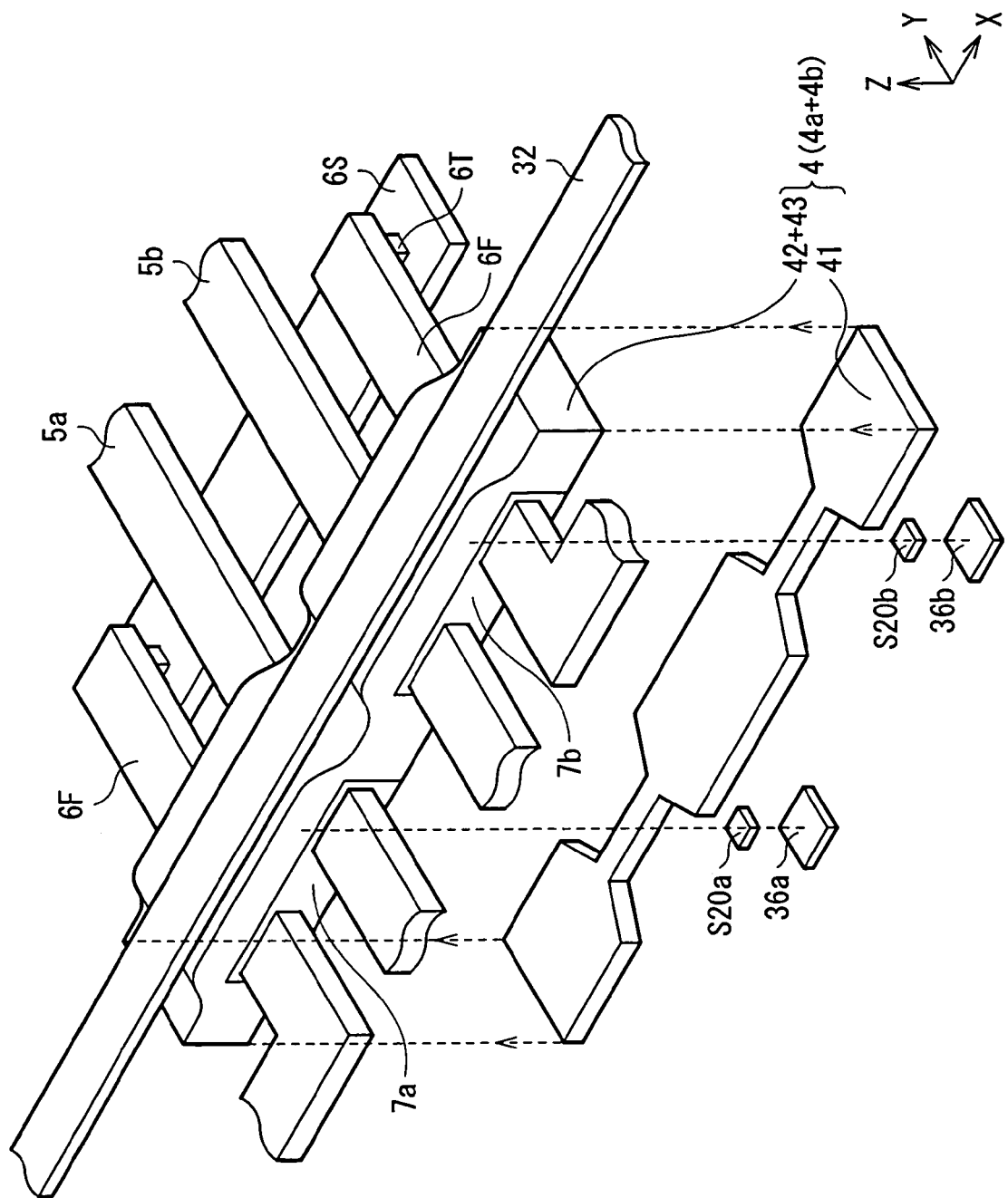
FIG. 20 is a perspective view showing the configuration of a main part as a first modification of the magnetic memory device illustrated in FIG. 1.

Although the invention has been described above by the embodiment and examples, the invention is not limited to the embodiments but can be variously modified. For example, in the foregoing embodiment, the part of the second level 6S as a connection conductor is provided in the same level as the beam yoke on the furthest side from the stacked bodies S20a and S20b. However, the invention is not limited to the configuration. As in a first modification shown in FIG. 20, the part of the second level 6S may be provided at the same level as that of a pair of beam yokes 41a and 41b on the side close to the stacked bodies S20a and S20b.

Figure 21:
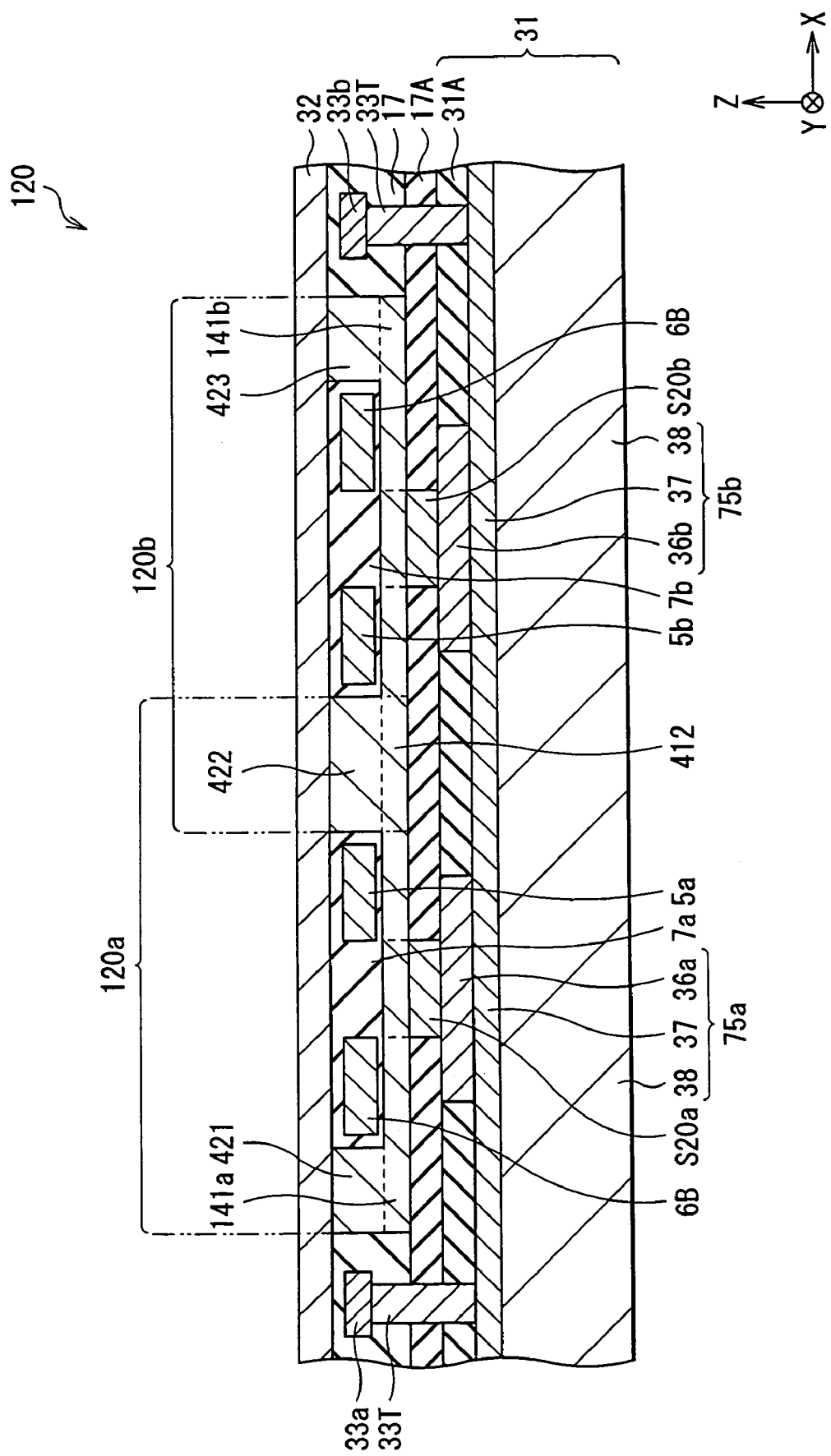
FIG. 21 is a cross section showing the configuration of a main part as a second modification of the magnetic memory device illustrated in FIG. 1.

In the forgoing embodiment, the case where the pair of magneto-resistive elements in a magnetic memory cell share a part of the magnetic yoke constructed so as to surround the whole periphery of the first and second write lines has been described, but the invention is not limited to the case. To be concrete, like a memory cell 120 (second modification) shown in FIG. 21, two U-shaped magnetic yokes (magnetic yokes each having a sectional shape a part of which is open) constructed to surround a part of the periphery of the first and second write lines and each having an opening on the side opposite to the stacked body may be connected to each other. The memory cell 120 has: a TMR element 120a including the magnetic yoke 4a constructed by a pair of pillar yokes 421 and 422 facing each other and extending in the direction orthogonal to the layer stacked face of the stacked body S20a and a beam yoke 141a connected to one end on the side of the stacked body S20a of each of the pair of pillar yokes 421 and 422; and a TMR element 120b including the magnetic yoke 4b constructed by a pair of pillar yokes 422 and 423 facing each other and extending in the direction orthogonal to the layer stacked face of the stacked body S20b and a beam yoke 141b connected to one end on the side of the stacked body S20b of each of the pair of pillar yokes 422 and 423. The pair of TMR elements 120a and 120b share the pillar yoke 422 and the common region 412 of the beam yokes 141a and 141b. Also in the memory cell 120 having such a configuration, the write bit lines 5a and 5b and the part of the first level 6F are arranged so as to be adjacent to each other in the first level L1 including the plane parallel with the layer stacked face of the stacked bodies S20a and S20b in the region surrounded by the magnetic yokes 4a and 4b. Therefore, at the time of manufacture, the write bit lines 5a and 5b and the part of the first level 6F can be simultaneously formed in the region surrounded by the magnetic yokes 4a and 4b, and the number of processes can be reduced. In this case, particularly, by forming the part of the second level 6S (not shown in FIG. 21) simultaneously with the beam yokes 141a and 141b, the number of processes can be further decreased. It is not always necessary to provide the pillar yokes 421 to 423. That is, a memory cell having the shape obtained by removing the pillar yokes 421 to 423 in the memory cell 122 shown in FIG. 21 may be also realized.

Figure 22:
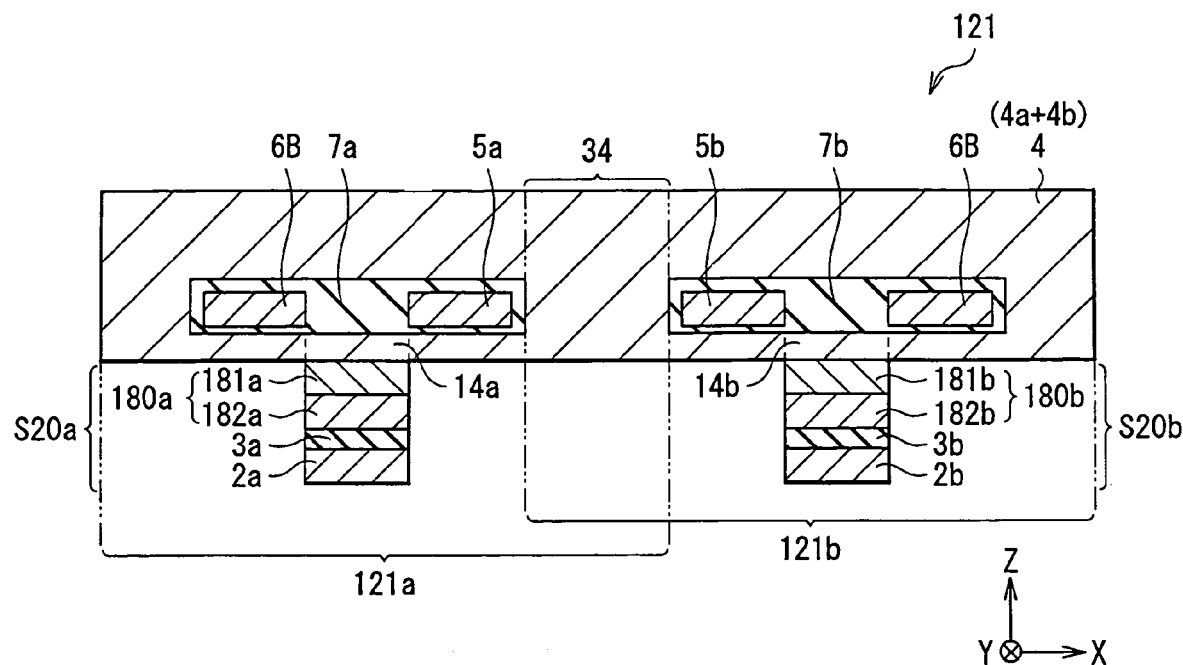
FIG. 22 is a cross section showing the configuration of a main part as a third modification of the magnetic memory device illustrated in FIG. 1.

The configuration of the stacked body is not limited to that of the stacked bodies S20a and S20b shown in FIG. 5 described in the foregoing embodiment. For example, like stacked bodies S21a and S21b of a memory cell 121 (third modification) shown in FIG. 22, the second magnetic layers 8a and 8b as magneto-sensitive layers may have a two-layered structure including first free magnetization layers 181a and 181b and second free magnetization layers 182a and 182b having a coercive force larger than that of the first free magnetization layers 181a and 181b, respectively. Although not shown, it is also possible to provide an antiferromagnetic layer on the side opposite to the tunnel barrier layers 3a and 3b of the first magnetic layers 2a and 2b in the stacked bodies S20a and S20b or the stacked bodies S21a and S21b to thereby stabilize magnetization of the first magnetic layers 2a and 2b. The stacked body is not limited to the configuration that current flows in the direction orthogonal to the layer stacked face but may be constructed so that current flows along the layer stacked face.

Figure 23:
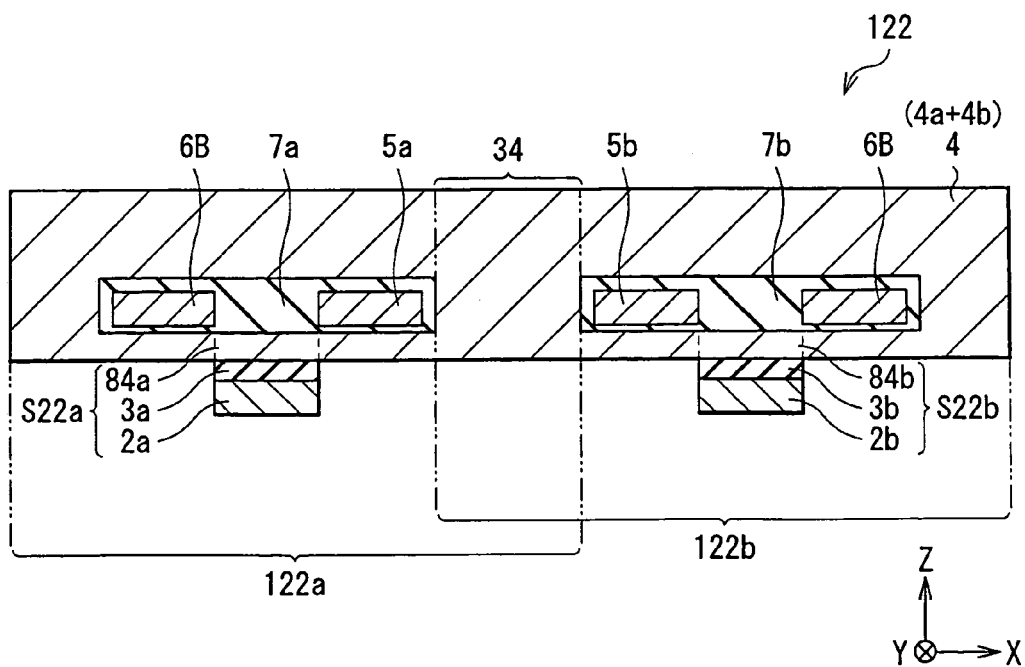
FIG. 23 is a cross section showing the configuration of a main part as a fourth modification of the magnetic memory device illustrated in FIG. 1.

Further, like a memory cell 122 in a magnetic memory device as a fourth modification shown in FIG. 23, connection parts 84a and 84b as part of the magnetic yokes 4a and 4b can also serve as the magneto-sensitive layers in the stacked bodies S22a and S22b. Specifically, in TMR elements 122a and 122b, the connection parts 84a and 84b as part of the magnetic yokes 4a and 4b also function as the magneto-sensitive layers in the stacked bodies S22a and S22b. Consequently, the second magnetic layers 8a and 8b provided in the TMR elements 1a and 1b can be omitted, and the memory cell 122 having a configuration simpler than that of the memory cell 1 can be achieved.

Figure 24:
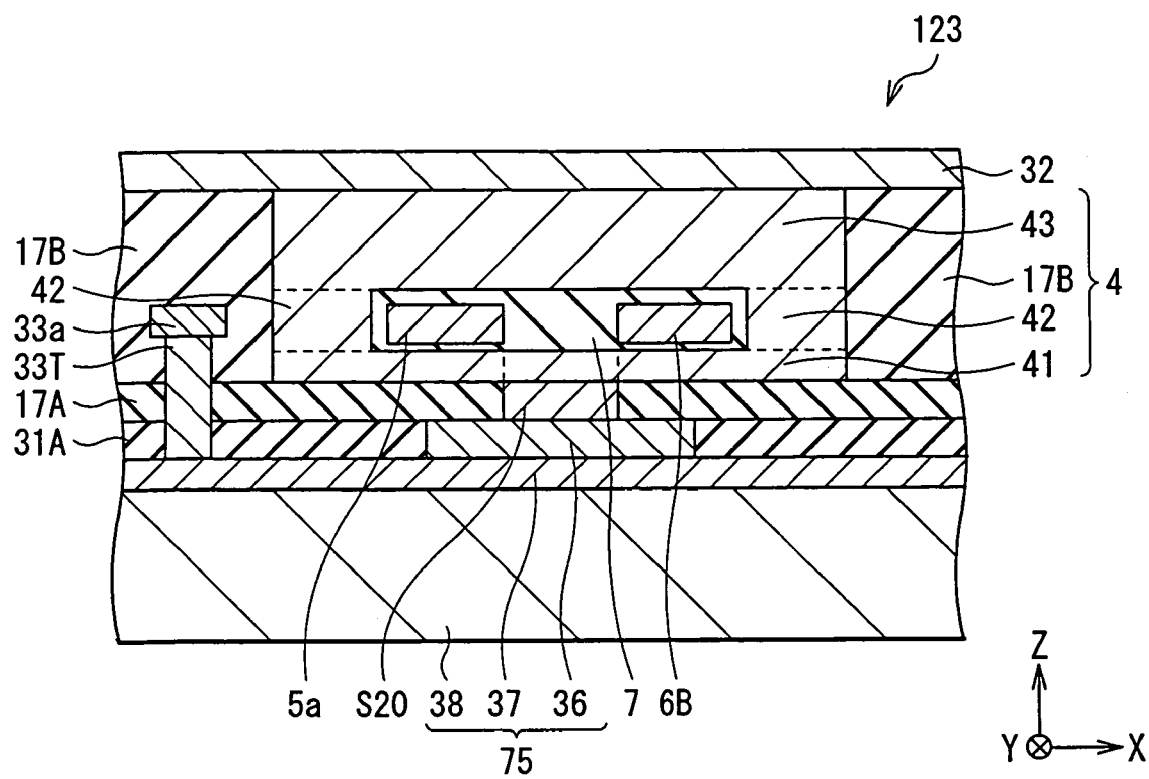
FIG. 24 is a cross section showing the configuration of a main part as a fifth modification of the magnetic memory device illustrated in FIG. 1.
Figure 25:
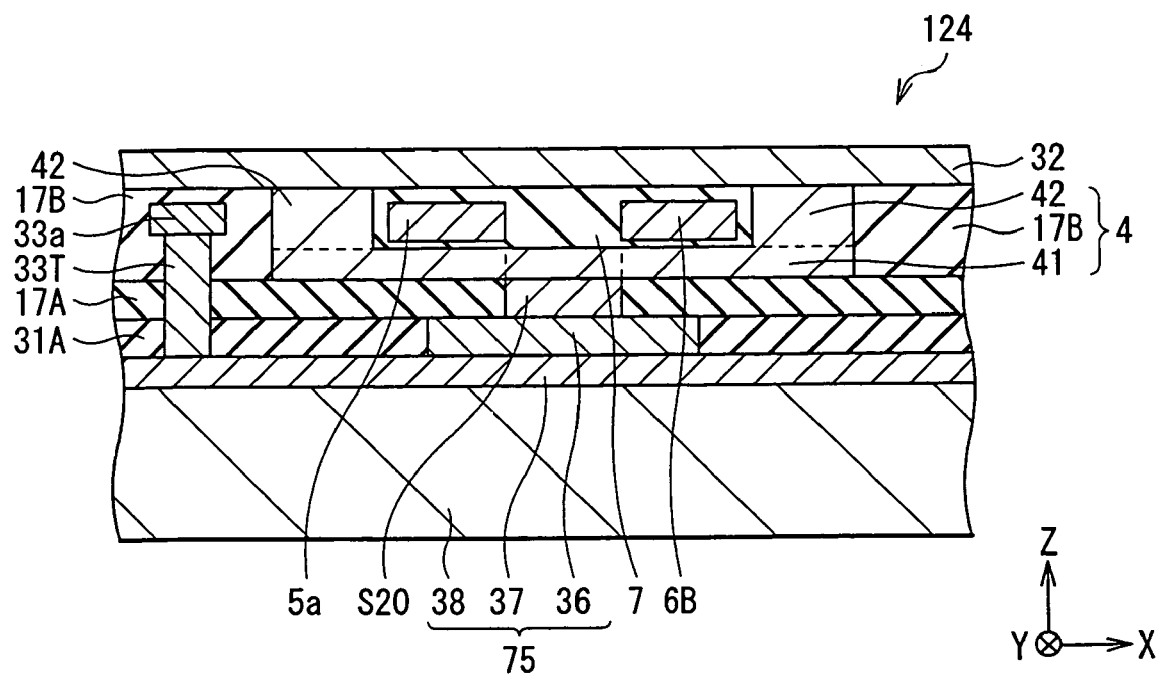
FIG. 25 is a cross section showing the configuration of a main part as a sixth modification of the magnetic memory device illustrated in FIG. 1.

Although the magnetic memory cell having a pair of magneto-resistive elements has been described in the foregoing embodiment, the invention is not limited to the magnetic memory cell. For example, like a TMR element 123 in a magnetic memory device as a fifth modification shown in FIG. 24, a single TMR element having one magnetic yoke 4 and one stacked body S20 may be used as a magnetic memory element. Also in the memory cell constructed by the single TMR element, like a TMR element 124 (sixth modification) shown in FIG. 25, not the magnetic yoke constructed so as to surround the whole periphery of the first and second write lines but a magnetic yoke having a U shape in cross section, a part of which is open may be provided.

Obviously many modifications and variations of the present invention are possible in the light of the above teachings. It is therefore to be understood that within the scope of the appended claims, the invention may be practiced otherwise than as specifically described.

What is claimed is:

1. A magnetic memory device comprising:
a first write line;
a second write line extending so as to cross the first write line; and
a magneto-resistive element,
wherein the magneto-resistive element includes:
a magnetic yoke disposed along a circumferential direction so as to surround the first and second write lines in a region in which the first and second write lines cross each other; and
a stacked body including a magneto-sensitive layer of which magnetization direction changes according to an external magnetic field and which is magnetically coupled to the magnetic yoke, and
the first and second write lines are disposed so as to be adjacent to each other via an insulating film in a first level in a region surrounded by the magnetic yoke.

2. A magnetic memory device comprising:
a first write line;
a second write line extending so as to cross the first write line; and
a magnetic memory cell,
wherein the magnetic memory cell includes a pair of magneto-resistive elements,
each of the pair of magneto-resistive elements has a magnetic yoke disposed along a circumferential direction so as to surround the first and second write lines in a region in which the first and second write lines cross each other; and a stacked body including a magneto-sensitive layer of which magnetization direction changes according to an external magnetic field and which is magnetically coupled to the magnetic yoke, the pair of magneto-resistive elements shares a part of the magnetic yoke, and
the first and second write lines are disposed so as to be adjacent to each other via an insulating film in a first level in the region surrounded by the magnetic yoke.

3. A magnetic memory device according to claim 2, wherein either a pair of first write lines or a pair of second write lines in a region surrounded by a pair of magnetic yokes is connected to each other via a connection conductor provided in a second level different from the first level in a region other than the region surrounded by the pair of magnetic yokes.

4. A magnetic memory device according to claim 3, wherein a part of the pair of magnetic yokes is provided in the second level.

5. A magnetic memory device according to claim 3, wherein each of the pair of magnetic yokes comprises
a pair of pillar yokes extending in a direction orthogonal to a layer stacked face of the stacked body while facing each other over the first and second write lines; and
a beam yoke to which one end of each of the pair of pillar yokes is connected, and has a sectional shape a part of which is open, and
the pair of magneto-resistive elements shares at least one of the pair of pillar yokes.

6. A magnetic memory device according to claim 5, wherein the beam yoke is provided in the second level.

7. A magnetic memory device according to claim 3, wherein each of the pair of magnetic yokes includes:
a pair of pillar yokes extending in a direction orthogonal to a layer stacked face of the stacked body while facing each other over the first and second write lines; and
a pair of beam yokes to which one end of each of the pair of pillar yokes is connected; and has a closed sectional shape, and
the pair of magneto-resistive elements shares at least one of the pair of pillar yokes.

8. A magnetic memory device according to claim 7, wherein one of the pair of beam yokes is provided in the second level.

9. A magnetic memory device according to claim 7, wherein one on the side far from the stacked body, of the pair of beam yokes is provided in the second level.

10. A magnetic memory device according to claim 2, wherein a part connected to the stacked body, in the magnetic yoke also serves as the magneto-resistive layer.

* * * * *